United States Patent [19]

Soden et al.

[11] Patent Number: 5,532,102
[45] Date of Patent: Jul. 2, 1996

[54] APPARATUS AND PROCESS FOR PREPARATION OF MIGRATION IMAGING MEMBERS

[75] Inventors: Philip H. Soden, Oakville; Arnold L. Pundsack, Georgetown, both of Canada

[73] Assignee: Xerox Corporation, Stamford, Conn.

[21] Appl. No.: 413,667

[22] Filed: Mar. 30, 1995

[51] Int. Cl.$^6$ ............................. C23C 14/00; C23C 14/24
[52] U.S. Cl. ........................... 430/128; 118/725; 118/719; 427/573
[58] Field of Search ..................... 118/719, 725; 430/57, 128; 427/573

[56] References Cited

U.S. PATENT DOCUMENTS

| | | | |
|---|---|---|---|
| 3,598,644 | 8/1971 | Gaffe et al. | 117/201 |
| 4,046,565 | 9/1977 | Miller | 430/57 |
| 4,482,622 | 11/1984 | Soden et al. | 430/135 |
| 4,854,264 | 8/1989 | Noma et al. | 118/719 |
| 4,956,670 | 9/1990 | Masuda et al. | 355/210 |
| 5,102,756 | 4/1992 | Vincett et al. | 430/41 |
| 5,168,543 | 12/1992 | Murray | 392/388 |

*Primary Examiner*—John Goodrow
*Attorney, Agent, or Firm*—Judith L. Byorick

[57] ABSTRACT

Disclosed is an apparatus for evaporation of a vacuum evaporatable material onto a substrate, said apparatus comprising (a) a walled container for the vacuum evaporatable material having a plurality of apertures in a surface thereof, said apertures being configured so that the vacuum evaporatable material is uniformly deposited onto the substrate; and (b) a source of heat sufficient to effect evaporation of the vacuum evaporatable material from the container through the apertures onto the substrate, wherein the surface of the container having the plurality of apertures therein is maintained at a temperature equal to or greater than the temperature of the vacuum evaporatable material.

28 Claims, 4 Drawing Sheets

APPARATUS AND PROCESS FOR PREPARATION OF MIGRATION IMAGING MEMBERS

BACKGROUND OF THE INVENTION

The present invention is directed to an apparatus and process for the preparation of migration imaging members. More specifically, the present invention is directed to an improved apparatus and process for vacuum deposition of evaporatable material onto a substrate. One embodiment of the present invention is directed to an apparatus for evaporation of a vacuum evaporatable material onto a substrate, said apparatus comprising (a) a walled container for the vacuum evaporatable material having a plurality of apertures in a surface thereof, said apertures being configured so that the vacuum evaporatable material is uniformly deposited onto the substrate; and (b) a source of heat sufficient to effect evaporation of the vacuum evaporatable material from the container through the apertures onto the substrate, wherein the surface of the container having the plurality of apertures therein is maintained at a temperature equal to or greater than the temperature of the vacuum evaporatable material. Another embodiment of the present invention is directed to a vacuum coating apparatus comprising a vacuum chamber containing (a) a migration imaging member comprising a first conductive layer and at least one additional layer, wherein at least one of the additional layers is a layer of softenable material; (b) a migration imaging member supply; (c) a migration imaging member takeup, the migration imaging member defining a path between the migration imaging member supply and the migration imaging member takeup; (d) a first member in contact with the migration imaging member and disposed in the path between the migration imaging member supply and the migration imaging member takeup, said first member being heated to a temperature which reduces the viscosity of the softenable material on the migration imaging member to a viscosity sufficiently low to enable material vacuum evaporated thereon to become embedded below the surface of the softenable layer; (e) a second member in contact with the migration imaging member and disposed in the path between the first member and the migration imaging member takeup, said second member being at a temperature which cools the softenable material on the migration imaging member sufficiently to prevent blocking of the softenable layer in the migration imaging member takeup; (f) a walled container for a vacuum evaporatable migration marking material disposed in the path between the first member and the second member, said container having a plurality of apertures in a surface thereof, said apertures being configured so that the vacuum evaporatable migration marking material is uniformly deposited on the substrate; and (g) a source of heat sufficient to effect evaporation of the vacuum evaporatable migration marking material from the container through the apertures onto the substrate, wherein the surface of the container having the plurality of apertures therein is maintained at a temperature equal to or greater than the temperature of the vacuum evaporatable migration marking material. Yet another embodiment of the present invention is directed to a method for evaporation of a vacuum evaporatable material onto a substrate comprising (a) heating a container of the vacuum evaporatable material to a temperature sufficient to prevent condensation of the vacuum evaporatable material at a plurality of discharge apertures, wherein the discharge apertures are configured so that the vacuum evaporatable material is uniformly deposited onto the substrate; (b) depositing the vacuum evaporatable material onto the substrate as the substrate is moved adjacent the discharge apertures.

Migration imaging systems capable of producing high quality images of high optical contrast density and high resolution have been developed. Such migration imaging systems are disclosed in, for example, U.S. Pat. Nos. 5,215,838, 5,202,206, 5,102,756, 5,021,308, 4,970,130, 4,937,163, 4,883,731, 4,880,715, 4,853,307, 4,536,458, 4,536,457, 4,496,642, 4,482,622, 4,281,050, 4,252,890, 4,241,156, 4,230,782, 4,157,259, 4,135,926, 4,123,283, 4,102,682, 4,101,321, 4,084,966, 4,081,273, 4,078,923, 4,072,517, 4,065,307, 4,062,680, 4,055,418, 4,040,826, 4,029,502, 4,028,101, 4,014,695, 4,013,462, 4,012,250, 4,009,028, 4,007,042, 3,998,635, 3,985,560, 3,982,939, 3,982,936, 3,979,210, 3,976,483, 3,975,739, 3,975,195, and 3,909,262, the disclosures of each of which are totally incorporated herein by reference, and in "Migration Imaging Mechanisms, Exploitation, and Future Prospects of Unique Photographic Technologies, XDM and AMEN", P. S. Vincett, G. J. Kovacs, M. C. Tam, A. L. Pundsack, and P. H. Soden, *Journal of Imaging Science* 30 (4) July/August, pp. 183–191 (1986), the disclosure of which is totally incorporated herein by reference.

The expression "softenable" as used herein is intended to mean any material which can be rendered more permeable, thereby enabling particles to migrate through its bulk. Conventionally, changing the permeability of such material or reducing its resistance to migration of migration marking material is accomplished by dissolving, swelling, melting, or softening, by techniques, for example, such as contacting with heat, vapors, partial solvents, solvent vapors, solvents, and combinations thereof, or by otherwise reducing the viscosity of the softenable material by any suitable means.

The expression "fracturable" layer or material as used herein means any layer or material which is capable of breaking up during development, thereby permitting portions of the layer to migrate toward the substrate or to be otherwise removed. The fracturable layer is preferably particulate in the various embodiments of the migration imaging members. Such fracturable layers of marking material are typically contiguous to the surface of the softenable layer spaced apart from the substrate, and such fracturable layers can be substantially or wholly embedded in the softenable layer in various embodiments of the imaging members.

The expression "contiguous" as used herein is intended to mean in actual contact, touching, also, near, though not in contact, and adjoining, and is intended to describe generically the relationship of the fracturable layer of marking material in the softenable layer with the surface of the softenable layer spaced apart from the substrate.

The expression "optically sign-retained" as used herein is intended to mean that the dark (higher optical density) and light (lower optical density) areas of the visible image formed on the migration imaging member correspond to the dark and light areas of the illuminating electromagnetic radiation pattern.

The expression "optically sign-reversed" as used herein is intended to mean that the dark areas of the image formed on the migration imaging member correspond to the light areas of the illuminating electromagnetic radiation pattern and the light areas of the image formed on the migration imaging member correspond to the dark areas of the illuminating electromagnetic radiation pattern.

The expression "optical contrast density" as used herein is intended to mean the difference between maximum optical density ($D_{max}$) and minimum optical density ($D_{min}$) of an image. Optical density is measured for the purpose of this invention by diffuse densitometers with a blue Wratten No. 94 filter. The expression "optical density" as used herein is intended to mean "transmission optical density" and is represented by the formula:

$$D = \log_{10}[l_o/l]$$

where l is the transmitted light intensity and $l_o$ is the incident light intensity. For the purpose of this invention, all values of transmission optical density given in this invention include the substrate density of about 0.2 which is the typical density of a metallized polyester substrate.

High optical density in migration imaging members allows high contrast densities in migration images made from the migration imaging members. High contrast density is highly desirable for most information storage systems. Contrast density is used herein to denote the difference between maximum and minimum optical density in a migration image. The maximum optical density value of an imaged migration imaging member is, of course, the same value as the optical density of an unimaged migration imaging member.

There are various other systems for forming such images, wherein non-photosensitive or inert marking materials are arranged in the aforementioned fracturable layers, or dispersed throughout the softenable layer, as described in the aforementioned patents, which also disclose a variety of methods which can be used to form latent images upon migration imaging members.

Various means for developing the latent images can be used for migration imaging systems. These development methods include solvent wash away, solvent vapor softening, heat softening, and combinations of these methods, as well as any other method which changes the resistance of the softenable material to the migration of particulate marking material through the softenable layer to allow imagewise migration of the particles in depth toward the substrate. In the solvent wash away or meniscus development method, the migration marking material in the light struck region migrates toward the substrate through the softenable layer, which is softened and dissolved, and repacks into a more or less monolayer configuration. In migration imaging films supported by transparent substrates alone, this region exhibits a maximum optical density which can be as high as the initial optical density of the unprocessed film. On the other hand, the migration marking material in the unexposed region is substantially washed away and this region exhibits a minimum optical density which is essentially the optical density of the substrate alone. Therefore, the image sense of the developed image is optically sign reversed. Various methods and materials and combinations thereof have previously been used to fix such unfixed migration images. One method is to overcoat the image with a transparent abrasion resistant polymer by solution coating techniques. In the heat or vapor softening developing modes, the migration marking material in the light struck region disperses in the depth of the softenable layer after development and this region exhibits $D_{min}$ which is typically in the range of 0.6 to 0.7. This relatively high $D_{min}$ is a direct consequence of the depthwise dispersion of the otherwise unchanged migration marking material. On the other hand, the migration marking material in the unexposed region does not migrate and substantially remains in the original configuration, i.e. a monolayer. In migration imaging films supported by transparent substrates, this region exhibits a maximum optical density ($D_{max}$) of about 1.8 to 1.9. Therefore, the image sense of the heat or vapor developed images is optically sign-retained.

Techniques have been devised to permit optically sign-reversed imaging with vapor development, but these techniques are generally complex and require critically controlled processing conditions. An example of such techniques can be found in U.S. Pat. No. 3,795,512, the disclosure of which is totally incorporated herein by reference.

For many imaging applications, it is desirable to produce negative images from a positive original or positive images from a negative original (optically sign-reversing imaging), preferably with low minimum optical density. Although the meniscus or solvent wash away development method produces optically sign-reversed images with low minimum optical density, it entails removal of materials from the migration imaging member, leaving the migration image largely or totally unprotected from abrasion. Although various methods and materials have previously been used to overcoat such unfixed migration images, the post-development overcoating step can be impractically costly and inconvenient for the end users. Additionally, disposal of the effluents washed from the migration imaging member during development can also be very costly.

The background portions of an imaged member can sometimes be transparentized by means of an agglomeration and coalescence effect. In this system, an imaging member comprising a softenable layer containing a fracturable layer of electrically photosensitive migration marking material is imaged in one process mode by electrostatically charging the member, exposing the member to an imagewise pattern of activating electromagnetic radiation, and softening the softenable layer by exposure for a few seconds to a solvent vapor thereby causing a selective migration in depth of the migration material in the softenable layer in the areas which were previously exposed to the activating radiation. The vapor developed image is then subjected to a heating step. Since the exposed particles gain a substantial net charge (typically 85 to 90 percent of the deposited surface charge) as a result of light exposure, they migrate substantially in depth in the softenable layer towards the substrate when exposed to a solvent vapor, thus causing a drastic reduction in optical density. The optical density in this region is typically in the region of 0.7 to 0.9 (including the substrate density of about 0.2) after vapor exposure, compared with an initial value of 1.8 to 1.9 (including the substrate density of about 0.2). In the unexposed region, the surface charge becomes discharged due to vapor exposure. The subsequent heating step causes the unmigrated, uncharged migration material in unexposed areas to agglomerate or flocculate, often accompanied by coalescence of the marking material particles, thereby resulting in a migration image of very low minimum optical density (in the unexposed areas) in the 0.25 to 0.35 range. Thus, the contrast density of the final image is typically in the range of 0.35 to 0.65. Alternatively, the migration image can be formed by heat followed by exposure to solvent vapors and a second heating step which also results in a migration image with very low minimum optical density. In this imaging system as well as in the previously described heat or vapor development techniques, the softenable layer remains substantially intact after development, with the image being self-fixed because the marking material particles are trapped within the softenable layer.

The word "agglomeration" as used herein is defined as the coming together and adhering of previously substantially separate particles, without the loss of identity of the particles.

The word "coalescence" as used herein is defined as the fusing together of such particles into larger units, usually accompanied by a change of shape of the coalesced particles towards a shape of lower energy, such as a sphere.

Generally, the softenable layer of migration imaging members is characterized by sensitivity to abrasion and foreign contaminants. Since a fracturable layer is located at or close to the surface of the softenable layer, abrasion can readily remove some of the fracturable layer during either manufacturing or use of the imaging member and adversely affect the final image. Foreign contamination such as finger prints can also cause defects to appear in any final image. Moreover, the softenable layer tends to cause blocking of migration imaging members when multiple members are stacked or when the migration imaging material is wound into rolls for storage or transportation. Blocking is the adhesion of adjacent objects to each other. Blocking usually results in damage to the objects when they are separated.

The sensitivity to abrasion and foreign contaminants can be reduced by forming an overcoating such as the overcoatings described in U.S. Pat. No. 3,909,262, the disclosure of which is totally incorporated herein by reference. However, because the migration imaging mechanisms for each development method are different and because they depend critically on the electrical properties of the surface of the softenable layer and on the complex interplay of the various electrical processes involving charge injection from the surface, charge transport through the softenable layer, charge capture by the photosensitive particles and charge ejection from the photosensitive particles, and the like, application of an overcoat to the softenable layer can cause changes in the delicate balance of these processes and result in degraded photographic characteristics compared with the non-overcoated migration imaging member. Notably, the photographic contrast density can degraded. Recently, improvements in migration imaging members and processes for forming images on these migration imaging members have been achieved. These improved migration imaging members and processes are described in U.S. Pat. Nos. 4,536,458 and 4,536,457.

U.S. Pat. No. 4,482,622 (Soden et al.), the disclosure of which is totally incorporated herein by reference, discloses a process for depositing particles within a softenable layer to form a migration imaging member wherein the layer is softened by heating, exposed in a first deposition zone to a high impingement rate of vapors of selenium or selenium alloy moving along in a line of sight path from a selenium or selenium alloy source to form a sub-surface monolayer of spherical particles comprising the selenium or selenium alloy, removed from the first deposition zone prior to a substantial dropoff in transmission optical density, exposed to a lower impingement rate of vapors of selenium or selenium alloy in a second deposition zone to increase the size of the spherical particles while maintaining a narrow particle size distribution and achieving a high surface packing density thereby increasing the transmission optical density of the imaging member, and thereafter removed from the second deposition zone prior to a substantial dropoff in transmission optical density.

U.S. Pat. No. 3,598,644 (Goffe et al.), the disclosure of which is totally incorporated herein by reference, discloses selenium vapor deposition methods of forming a fracturable layer comprising selenium contiguous the surface of a softenable layer.

Migration imaging members are also suitable for use as masks for exposing the photosensitive material in a printing plate. The migration imaging member can be laid on the plate prior to exposure to radiation, or the migration imaging member layers can be coated or laminated onto the printing plate itself prior to exposure to radiation, and removed subsequent to exposure.

U.S. Pat. No. 5,102,756 (Vincett et al.), the disclosure of which is totally incorporated herein by reference, discloses a printing plate precursor which comprises a base layer, a layer of photohardenable material, and a layer of softenable material containing photosensitive migration marking material. Alternatively, the precursor can comprise a base layer and a layer of softenable photohardenable material containing photosensitive migration marking material. Also disclosed are processes for preparing printing plates from the disclosed precursors.

Copending application U.S. Ser. No. 08/353,461, filed Dec. 9, 1994, entitled "Improved Migration Imaging Members," with the named inventors Edward G. Zwartz, Carol A. Jennings, Man C. Tam, Philip H. Soden, Arthur Y. Jones, Arnold L. Pundsack, Enrique Levy, Ah-Mee Hor, and William W. Limburg, the disclosure of which is totally incorporated herein by reference, discloses a migration imaging member comprising a substrate, a first softenable layer comprising a first softenable material and a first migration marking material contained at or near the surface of the first softenable layer spaced from the substrate, and a second softenable layer comprising a second softenable material and a second migration marking material. Also disclosed is a migration imaging process employing the aforesaid imaging member.

While known apparatus and processes for preparing migration imaging members are suitable for their intended purposes, a need remains for apparatus and processes for preparing migration imaging members which enable improved uniformity of deposition of the migration marking material on the imaging member. In addition, there is a need for apparatus and processes for preparing migration imaging members which enable stability and uniformity of the rate of deposition of migration marking material over a period of production time. Further, there is a need for apparatus and processes for preparing migration imaging members which reduce or eliminate the need to adjust the speed at which the imaging member passes through the migration marking material coating device. Additionally, a need exists for apparatus and processes for preparing migration imaging members which reduce or eliminate the need to adjust the evaporation rate of migration marking material with shutters on the crucible containing the migration marking material. There is also a need for apparatus and processes for preparing migration imaging members which enable precise control of the structure of the imaging member. In addition, a need remains for apparatus and processes for preparing migration imaging members which enable migration imaging members of improved optical density. Further, there is a need for apparatus and processes for preparing migration imaging members which enable coating of the migration marking material onto the imaging member in a reduced amount of space. Additionally, a need remains for apparatus and processes for preparing migration imaging members which enable coating of the migration marking material onto the imaging member at reduced cost. There is also a need for apparatus and processes which enable uniform evaporation of an evaporatable material across a wide web with a single evaporation source.

SUMMARY OF THE INVENTION

It is an object of the present invention to provide apparatus and processes for preparing migration imaging members with the above advantages.

It is another object of the present invention to provide apparatus and processes for preparing migration imaging members which enable improved uniformity of deposition of the migration marking material on the imaging member.

It is yet another object of the present invention to provide apparatus and processes for preparing migration imaging members which enable stability and uniformity of the rate of deposition of migration marking material over a period of production time.

It is still another object of the present invention to provide apparatus and processes for preparing migration imaging members which reduce or eliminate the need to adjust the speed at which the imaging member passes through the migration marking material coating device.

Another object of the present invention is to provide apparatus and processes for preparing migration imaging members which reduce or eliminate the need to adjust the evaporation rate of migration marking material with shutters on the crucible containing the migration marking material.

Yet another object of the present invention is to provide apparatus and processes for preparing migration imaging members which enable precise control of the structure of the imaging member.

Still another object of the present invention is to provide apparatus and processes for preparing migration imaging members which enable migration imaging members of improved optical density.

It is another object of the present invention to provide apparatus and processes for preparing migration imaging members which enable coating of the migration marking material onto the imaging member in a reduced amount of space.

It is yet another object of the present invention to provide apparatus and processes for preparing migration imaging members which enable coating of the migration marking material onto the imaging member at reduced cost.

It is still another object of the present invention to provide apparatus and processes which enable uniform evaporation of an evaporatable material across a wide web with a single evaporation source.

These and other objects of the present invention (or specific embodiments thereof) can be achieved by providing an apparatus for evaporation of a vacuum evaporatable material onto a substrate, said apparatus comprising (a) a walled container for the vacuum evaporatable material having a plurality of apertures in a surface thereof, said apertures being configured so that the vacuum evaporatable material is uniformly deposited onto the substrate; and (b) a source of heat sufficient to effect evaporation of the vacuum evaporatable material from the container through the apertures onto the substrate, wherein the surface of the container having the plurality of apertures therein is maintained at a temperature equal to or greater than the temperature of the vacuum evaporatable material. Another embodiment of the present invention is directed to a vacuum coating apparatus comprising a vacuum chamber containing (a) a migration imaging member comprising a first conductive layer and at least one additional layer, wherein at least one of the additional layers is a layer of softenable material; (b) a migration imaging member supply; (c) a migration imaging member takeup, the migration imaging member defining a path between the migration imaging member supply and the migration imaging member takeup; (d) a first member in contact with the migration imaging member and disposed in the path between the migration imaging member supply and the migration imaging member takeup, said first member being heated to a temperature which reduces the viscosity of the softenable material on the migration imaging member to a viscosity sufficiently low to enable material vacuum evaporated thereon to become embedded below the surface of the softenable layer; (e) a second member in contact with the migration imaging member and disposed in the path between the first member and the migration imaging member takeup, said second member being at a temperature which cools the softenable material on the migration imaging member sufficiently to prevent blocking of the softenable layer in the migration imaging member takeup; (f) a walled container for a vacuum evaporatable migration marking material disposed in the path between the first member and the second member, said container having a plurality of apertures in a surface thereof, said apertures being configured so that the vacuum evaporatable migration marking material is uniformly deposited on the substrate; and (g) a source of heat sufficient to effect evaporation of the vacuum evaporatable migration marking material from the container through the apertures onto the substrate, wherein the surface of the container having the plurality of apertures therein is maintained at a temperature equal to or greater than the temperature of the vacuum evaporatable migration marking material. Yet another embodiment of the present invention is directed to a method for evaporation of a vacuum evaporatable material onto a substrate comprising (a) heating a container of the vacuum evaporatable material to a temperature sufficient to prevent condensation of the vacuum evaporatable material at a plurality of discharge apertures, wherein the discharge apertures are configured so that the vacuum evaporatable material is uniformly deposited onto the substrate; (b) depositing the vacuum evaporatable material onto the substrate as the substrate is moved adjacent the discharge apertures.

DETAILED DESCRIPTION OF THE INVENTION

The apparatus and processes of the present invention enable preparation of migration imaging members. An example of a migration imaging member which can be prepared by the process of the present invention is illustrated schematically in FIG. 1.

Figure 1:
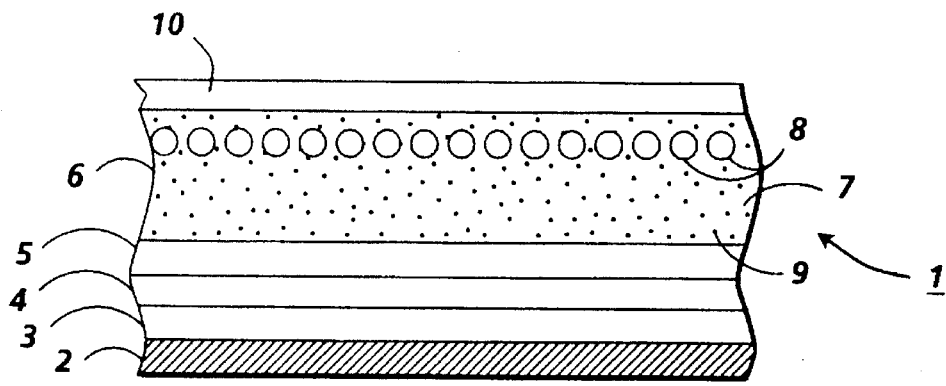
FIG. 1 illustrates schematically a migration imaging member which can be prepared by the apparatus and processes of the present invention.

As illustrated schematically in FIG. 1, migration imaging member 1 comprises a substrate 2, an optional adhesive layer 3 situated on the substrate 2, an optional charge blocking layer 4 situated on optional adhesive layer 3, an optional charge transport layer 5 situated on optional charge blocking layer 4, and a softenable layer 6 situated on optional charge transport layer 5, said softenable layer 6 comprising softenable material 7, migration marking material 8 situated at or near the surface of the layer spaced from the substrate, and optional charge transport material 9 dispersed throughout softenable material 7. Optional overcoating layer 10 is situated on the surface of softenable layer 6 spaced from the substrate 2. Any or all of the optional layers and materials can be absent from the imaging member. In addition, any of the optional layers present need not be in the order shown, but can be in any suitable arrangement. The migration imaging member can be in any suitable configuration, such as a web, a foil, a laminate, a strip, a sheet, a coil, a cylinder, a drum, an endless belt, an endless mobius strip, a circular disc, or any other suitable form.

The substrate can be either electrically conductive or electrically insulating. When conductive, the substrate can be opaque, translucent, semitransparent, or transparent, and can be of any suitable conductive material, including copper, brass, nickel, zinc, chromium, stainless steel, conductive plastics and rubbers, aluminum, semitransparent aluminum, steel, cadmium, silver, gold, paper rendered conductive by the inclusion of a suitable material therein or through conditioning in a humid atmosphere to ensure the presence of sufficient water content to render the material conductive, indium, tin, metal oxides, including tin oxide and indium tin oxide, and the like. When insulative, the substrate can be opaque, translucent, semitransparent, or transparent, and can be of any suitable insulative material, such as paper, glass, plastic, polyesters such as Mylar® (available from Du Pont) or Melinex® 442 (available from ICI Americas, Inc.), and the like. In addition, the substrate can comprise an insulative layer with a conductive coating, such as vacuum-deposited metallized plastic, such as titanized or aluminized Mylar® polyester, wherein the metallized surface is in contact with the softenable layer or any other layer situated between the substrate and the softenable layer. The substrate has any effective thickness, typically from about 6 to about 250 microns, and preferably from about 50 to about 200 microns, although the thickness can be outside these ranges.

The softenable layer can comprise one or more layers of softenable materials, which can be any suitable material, typically a plastic or thermoplastic material which is soluble in a solvent or softenable, for example, in a solvent liquid, solvent vapor, heat, or any combinations thereof. When the softenable layer is to be softened or dissolved either during or after imaging, it should be soluble in a solvent that does not attack the migration marking material. By softenable is meant any material that can be rendered by a development step as described herein permeable to migration material migrating through its bulk. This permeability typically is achieved by a development step entailing dissolving, melting, or softening by contact with heat, vapors, partial solvents, as well as combinations thereof. Examples of suitable softenable materials include styrene-acrylic copolymers, such as styrene-hexylmethacrylate copolymers, styrene acrylate copolymers, styrene butylmethacrylate copolymers, styrene butylacrylate ethylacrylate copolymers, styrene ethylacrylate acrylic acid copolymers, and the like, polystyrenes, including polyalphamethyl styrene, alkyd substituted polystyrenes, styrene-olefin copolymers, styrenevinyltoluene copolymers, polyesters, polyurethanes, polycarbonates, polyterpenes, silicone elastomers, mixtures thereof, copolymers thereof, and the like, as well as any other suitable materials as disclosed, for example, in U.S. Pat. No. 3,975, 195 and other U.S. patents directed to migration imaging members which have been incorporated herein by reference.

The softenable layer can be of any effective thickness, typically from about 1 to about 30 microns, preferably from about 2 to about 25 microns, and more preferably from about 2 to about 10 microns, although the thickness can be outside these ranges. The softenable layer can be applied to the conductive layer by any suitable coating process. Typical coating processes include draw bar coating, spray coating, extrusion, dip coating, gravure roll coating, wire-wound rod coating, air knife coating and the like.

The softenable layer also contains migration marking material. The migration marking material can be electrically photosensitive, photoconductive, or of any other suitable combination of materials, or possess any other desired physical property and still be suitable for use in the migration imaging members of the present invention. The migration marking materials preferably are particulate, wherein the particles are closely spaced from each other. Preferred migration marking materials generally are spherical in shape and submicron in size. The migration marking material generally is capable of substantial photodischarge upon electrostatic charging and exposure to activating radiation and is substantially absorbing and opaque to activating radiation in the spectral region where the photosensitive migration marking particles photogenerate charges. The migration marking material is generally present as a thin layer or monolayer of particles situated at or near the surface of the softenable layer spaced from the conductive layer. When present as particles, the particles of migration marking material preferably have an average diameter of up to 2 microns, and more preferably of from about 0.1 to about 1 micron. The layer of migration marking particles is situated at or near that surface of the softenable layer spaced from or most distant from the conductive layer. Preferably, the particles are situated at a distance of from about 0.01 to 0.1 micron from the layer surface, and more preferably from about 0.02 to 0.08 micron from the layer surface. Preferably, the particles are situated at a distance of from about 0.005 to about 0.2 micron from each other, and more preferably at a distance of from about 0.05 to about 0.1 micron from each other, the distance being measured between the closest edges of the particles, i.e. from outer diameter to outer diameter. The migration marking material contiguous to the outer surface of the softenable layer is present in any effective amount, preferably from about 5 to about 80 percent by total weight of the softenable layer, and more preferably from about 25 to about 80 percent by total weight of the softenable layer, although the amount can be outside of this range.

Examples of suitable migration marking materials include selenium, alloys of selenium with alloying components such as tellurium, arsenic, antimony, thallium, bismuth, or mixtures thereof, selenium and alloys of selenium doped with halogens, as disclosed in, for example, U.S. Pat. No. 3,312, 548, the disclosure of which is totally incorporated herein by reference, and the like, phthalocyanines, and any other suitable materials as disclosed, for example, in U.S. Pat. No. 3,975,195 and other U.S. patents directed to migration imaging members and incorporated herein by reference.

If desired, two or more softenable layers, each containing migration marking particles, can be present in the imaging member as disclosed in copending application U.S. Ser. No. 08/353,461, filed Dec. 9, 1994, entitled "Improved Migration Imaging Members," with the named inventors Edward G. Zwartz, Carol A. Jennings, Man C. Tam, Philip H. Soden, Arthur Y. Jones, Arnold L. Pundsack, Enrique Levy, Ah-Mee Hor, and William W. Limburg, the disclosure of which is totally incorporated herein by reference.

The migration imaging members can optionally contain a charge transport material. The charge transport material can be any suitable charge transport material either capable of acting as a softenable layer material or capable of being dissolved or dispersed on a molecular scale in the softenable layer material. When a charge transport material is also contained in another layer in the imaging member, preferably there is continuous transport of charge through the entire film structure. The charge transport material is defined as a material which is capable of improving the charge injection process for one sign of charge from the migration marking material into the softenable layer and also of transporting that charge through the softenable layer. The charge transport material can be either a hole transport material (transports positive charges) or an electron transport material (transports negative charges). The sign of the charge used to sensitize the migration imaging member during imaging can be of either polarity. Charge transporting materials are well known in the art. Typical charge transporting materials include the following:

Diamine transport molecules of the type described in U.S. Pat. Nos. 4,306,008, 4,304,829, 4,233,384, 4,115,116, 4,299,897, and 4,081,274, the disclosures of each of which are totally incorporated herein by reference. Typical diamine transport molecules include N,N'-diphenyl-N,N'-bis(3"-methylohenyl)-(1,1'-biphenyl)-4,4'-diamine, N,N'-diphenyl-N,N'-bis(4-methylpheny)-(1,1'-biphenyl)-4,4'-diamine, N,N'-diphenyl-N,N'-bis(2-methylphenyl)-(1,1'-biphenyl)-4,4'-diamine, N,N'-diphenyl-N,N'-bis(3-ethylpheny)-(1,1'-biphenyl)-4,4'-diamine, N,N'-diphenyl-N,N'-bis(4-ethylphenyl)-(1,1'-biphenyl)-4,4'-diamine, N,N'-diphenyl-N,N'-bis(4-n-butylphenyl)-(1,1'-biphenyl)-4,4'-diamine, N,N'-diphenyl-N,N'-bis(3-chlorohenyl)-[1,1'-biphenyl]-4,4'-diamine, N,N'-diphenyl-N,N'-bis(4-chlorophenyl)-[1,1'-biphenyl]-4,4'-diamine, N,N'-diphenyl-N,N'-bis(phenylmethyl)-[1,1'-biphenyl]-4,4'-diamine, N,N,N',N'-tetraphenyl-[2,2'-dimethyl-1,1'-biphenyl]-4,4'-diamine, N,N,N',N'-tetra-(4-methylphenyl)-[2,2'-dimethyl-1,1'-biphenyl]-4,4'-diamine, N,N'-diphenyl-N,N'-bis(4-methylphenyl)-[2,2'-dimethyl-1,1'-biphenyl]-4,4'-diamine, N,N'-diphenyl--N,N'-bis(2-methylphenyl)-[2,2'-dimethyl-1,1'-biphenyl]-4,4'-diamine, N,N'-diphenyl-N,N'-bis(3-methylphenyl)-[2,2'-dimethyl-1,1'-biphenyl]-4,4'-diamine, N,N'-diphenyl-N,N'-bis(3-methylphenyl)-pyrenyl-1,6-diamine, and the like.

Pyrazoline transport molecules as disclosed in U.S. Pat. Nos. 4,315,982, 4,278,746, and 3,837,851, the disclosures of each of which are totally incorporated herein by reference. Typical pyrazoline transport molecules include 1-[lepidyl-(2)]-3-(p-diethylaminophenyl)-5-(p-diethylaminophenyl)pyrazoline, 1-[quinolyl-(2)]-3-(p-diethylaminophenyl)-5-(p-diethylaminophenyl)pyrazoline, 1-[pyridyl-(2)]-3-(p-diethylaminostyryl)-5-(p-diethylaminophenyl)pyrazoline, 1-[6-methoxypryidyl-(2)]-3-(p-diethylaminostyryl)-5-(p-diethylaminophenyl) pyrazoline, 1-phenyl-3-[p-dimethylaminostyryl]-5-(pdimethylaminostyryl)pyrazoline, 1-phenyl-3-[p-diethylaminostyryl]-5-(p-diethylaminostyryl)pyrazoline, and the like.

Substituted fluorene charge transport molecules as described in U.S. Pat. No. 4,245,021, the disclosure of which is totally incorporated herein by reference. Typical fluorene charge transport molecules include 9-(4'-dimethylaminobenzylidene)fluorene, 9-(4'-methoxybenzylidene)fluorene, 9-(2',4'-dimethoxybenzylidene)fluorene, 2-nitro-9-benzylidene-fluorene, 2-nitro-9-(4'-diethylaminobenzylidene)fluorene, and the like.

Oxadiazole transport molecules such as 2,5-bis(4-diethylaminopheynyl)-1,3,4-oxadiazole, pyrazoline, imidazole, triazole, and the like. Other typical oxadiazole transport molecules are described, for example, in German Patent 1,058,836, German Patent 1,060,260, and German Patent 1,120,875, the disclosures of each of which are totally incorporated herein by reference.

Hydrazone transport molecules, such as p-diethylamino benzaldehyde-(diphenylhydrazone), o-ethoxy-p-diethylaminobenzaldehyde-(diphenenylhydrazone), o-methyl-p-diethyylaminobenzaldehyde-(diphenylhydrazone), o-methyl-p-dimethylaminobenzaldehyde-(diphenylhydrazone), 1-naphthalenecarbaldehyde 1-methyl-1-phenylhydrazone, 1-naphthalenecarbaldehyde 1,1-phenylhydrazone, 4-methoxynaphthlene-1-carbaldeyde 1-methyl-1-phenylhydrazone, and the like. Other typical hydrazone transport molecules are described, for example in U.S. Pat. Nos. 4,150,987, 4,385,106, 4,338,388, and 4,387,147, the disclosures of each of which are totally incorporated herein by reference.

Carbazole phenyl hydrazone transport molecules such as 9-methylcarbazole-3-carbaldehyde-1,1-diphenylhydrazone, 9-ethylcarbazole-3-carbaldehyde-1-methyl-1-phenylhydrazone, 9-ethylcarbazole-3-carbaldehyde-1-ethyl-1-phenylhydrazone, 9-ethylcarbazole-3-carbaldehyde-1-ethyl-1-benzyl-1-phenylhydrazone, 9-ethylcarbazole-3-carbaldehyde-1,1-diphenylhydrazone, and the like. Other typical carbazole phenyl hydrazone transport molecules are described, for example, in U.S. Pat. Nos. 4,256,821 and 4,297,426, the disclosures of each of which are totally incorporated herein by reference.

Vinyl-aromatic polymers such as polyvinyl anthracene, polyacenaphthylene; formaldehyde condensation products with various aromatics such as condensates of formaldehyde and 3-bromopyrene; 2,4,7-trinitrofluorenone, and 3,6-dinitro-N-t-butylnaphthalimide as described, for example, in U.S. Pat. No. 3,972,717, the disclosure of which is totally incorporated herein by reference.

Oxadiazole derivatives such as 2,5-bis-(p-diethylaminophenyl)-oxadiazole-1,3,4 described in U.S. Pat. No. 3,895,944, the disclosure of which is totally incorporated herein by reference.

Tri-substituted methanes such as alkyl-bis(N,N-dialkylaminoaryl)methane, cycloalkyl-bis(N,N-dialkylaminoaryl)methane, and cycloalkenyl-bis(N,N-dialkylaminoaryl)methane as described in U.S. Pat. No. 3,820,989, the disclosure of which is totally incorporated herein by reference.

9-Fluorenylidene methane derivatives having the formula

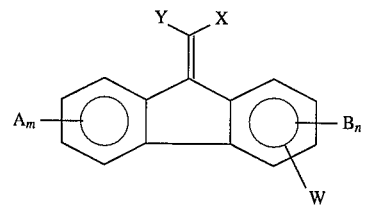

wherein X and Y are cyano groups or alkoxycarbonyl groups; A, B, and W are electron withdrawing groups independently selected from the group consisting of acyl, alkoxycarbonyl, nitro, alkylaminocarbonyl, and derivatives thereof; m is a number of from 0 to 2; and n is the number 0 or 1 as described in U.S. Pat. No. 4,474,865, the disclosure of which is totally incorporated herein by reference. Typical 9-fluorenylidene methane derivatives encompassed by the above formula include (4-n-butoxycarbonyl-9-fluorenylidene)malonontrile, (4-phenethoxycarbonyl-9fluorenylidene)malonontrile, (4-carbitoxy-9-fluorenylidene)malonontrile, (4-n-butoxycarbonyl-2,7-dinitro-9-fluorenylidene)malonate, and the like.

Other charge transport materials include poly-1-vinylpyrene, poly-9-vinylanthracene, poly-9-(4-pentenyl)-carbazole, poly-9-(5-hexyl)carbazole, polymethylene pyrene, poly-1-(pyrenyl)-butadiene, polymers such as alkyl, nitro, amino, halogen, and hydroxy substitute polymers such as poly-3-amino carbazole, 1,3-dibromo-poly-N-vinyl carbazole, 3,6-dibromo-poly-N-vinyl carbazole, and numerous other transparent organic polymeric or non-polymeric transport materials as described in U.S. Pat. No. 3,870,516, the disclosure of which is totally incorporated herein by reference. Also suitable as charge transport materials are phthalic anhydride, tetrachlorophthalic anhydride, benzil, mellitic anhydride, S-tricyanobenzene, picryl chloride, 2,4-dinitrochlorobenzene, 2,4-dinitrobromobenzene, 4-nitrobiphenyl, 4,4-dinitrophenyl, 2,4,6-trinitroanisole, trichlorotrinitrobenzene, trinitro-O-toluene, 4,6-dichloro-1,3-dinitrobenzene, 4,6-dibromo-1,3-dinitrobenzene, P-dinitrobenzene, chloranil, bromanil, and mixtures thereof, 2,4,7-trinitro-9-fluorenone, 2,4,5,7-tetranitrofluorenone, trinitroanthracene, dinitroacridene, tetracyanopyrene, dinitroanthraquinone, polymers having aromatic or heterocyclic groups with more than one strongly electron withdrawing substituent such as nitro, sulfonate, carboxyl, cyano, or the like, including polyesters, polysiloxanes, polyamides, polyurethanes, and epoxies, as well as block, graft, or random copolymers containing the aromatic moiety, and the like, as well as mixtures thereof, as described in U.S. Pat. No. 4,081,274, the disclosure of which is totally incorporated herein by reference.

Also suitable are charge transport materials such as triarylamines, including tritolyl amine, of the formula

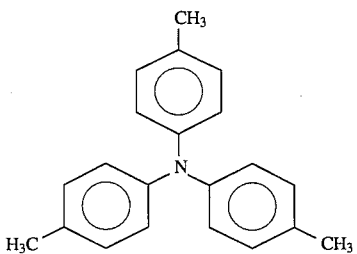

and the like, as disclosed in, for example, U.S. Pat. Nos. 3,240,597 and 3,180,730, the disclosures of which are totally incorporated herein by reference, and substituted diarylmethane and triarylmethane compounds, including bis-(4-diethylamino-2-methylphenyl)-phenylmethane, of the formula

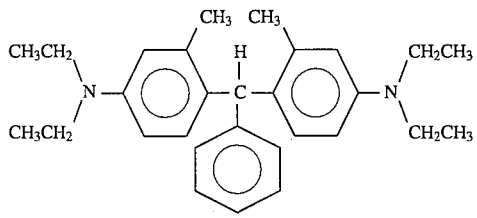

and the like, as disclosed in, for example, U.S. Pat. Nos. 4,082,551, 3,755,310, 3,647,431, British Patent 984,965, British Patent 980,879, and British Patent 1,141,666, the disclosures of which are totally incorporated herein by reference.

When the charge transport molecules are combined with an insulating binder to form the softenable layer, the amount of charge transport molecule which is used can vary depending upon the particular charge transport material and its compatibility (e.g. solubility) in the continuous insulating film forming binder phase of the softenable matrix layer and the like. Satisfactory results have been obtained using between about 5 percent to about 50 percent by weight charge transport molecule based on the total weight of the softenable layer. A particularly preferred charge transport molecule is one having the general formula

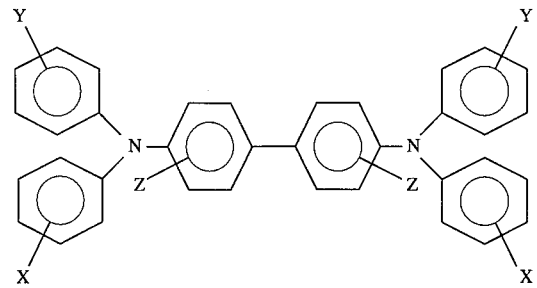

wherein X, Y and Z are selected from the group consisting of hydrogen, an alkyl group having from 1 to about 20 carbon atoms and chlorine, and at least one of X, Y and Z is independently selected to be an alkyl group having from 1 to about 20 carbon atoms or chlorine. If Y and Z are hydrogen, the compound can be named N,N'-diphenyl-N, N'-bis(alkylphenyl)-[1,1'-biphenyl]-4,4'-diamine wherein the alkyl is, for example, methyl, ethyl, propyl, n-butyl, or the like, or the compound can be N,N'-diphenyl-N,N'-bis(chlorophenyl)-[1,1'-biphenyl]-4,4'-diamine. results can be obtained when the softenable layer contains between about 8 percent to about 40 percent by weight of these diamine compounds based on the total weight of the softenable layer. Optimum results are achieved when the softenable layer contains between about 16 percent to about 32 percent by weight of N,N'-diphenyl-N,N'-bis(3"-methylphenyl)-(1,1'-biphenyl)-4,4'-diamine based on the total weight of the softenable layer.

The charge transport material is present in the softenable material in any effective amount, typically from about 5 to about 50 percent by weight and preferably from about 8 to about 40 percent by weight, although the amount can be outside these ranges. Alternatively, the softenable layer can employ the charge transport material as the softenable material if the charge transport material possesses the necessary film-forming characteristics and otherwise functions as a softenable material. The charge transport material can be incorporated into the softenable layer by any suitable technique. For example, it can be mixed with the softenable layer components by dissolution in a common solvent. If desired, a mixture of solvents for the charge transport material and the softenable layer material can be employed to facilitate mixing and coating. The charge transport molecule and softenable layer mixture can be applied to the substrate by any conventional coating process. Typical coating processes include draw bar coating, spray coating, extrusion, dip coating, gravure roll coating, wire-wound rod coating, air knife coating, and the like.

The optional adhesive layer can include any suitable adhesive material. Typical adhesive materials include copolymers of styrene and an acrylate, polyester resin such as DuPont 49000 (available from E. I. dupont de Nemours Company), copolymer of acrylonitrile and vinylidene chloride, polyvinyl acetate, polyvinyl butyral and the like and mixtures thereof. The adhesive layer can have any thickness, typically from about 0.05 to about 1 micron, although the thickness can be outside of this range. When an adhesive layer is employed, it preferably forms a uniform and continuous layer having a thickness of about 0.5 micron or less to ensure satisfactory discharge during the imaging process. It can also optionally include charge transport molecules.

The optional charge transport layer can comprise any suitable film forming binder material. Typical film forming binder materials include styrene acrylate copolymers, polycarbonates, co-polycarbonates, polyesters, co-polyesters, polyurethanes, polyvinyl acetate, polyvinyl butyral, polystyrenes, alkyd substituted polystyrenes, styrene-olefin copolymers, styrene-co-n-hexylmethacrylate, an 80/20 mole percent copolymer of styrene and hexylmethacrylate having an intrinsic viscosity of 0.179 dl/gm; other copolymers of styrene and hexylmethacrylate, styrene-vinyltoluene copolymers, polyalpha-methylstyrene, mixtures thereof, and copolymers thereof. The above group of materials is not intended to be limiting, but merely illustrative of materials suitable as film forming binder materials in the optional charge transport layer. The film forming binder material typically is substantially electrically insulating and does not adversely chemically react during the imaging process. Although the optional charge transport layer has been described as coated on a substrate, in some embodiments, the charge transport layer itself can have sufficient strength and integrity to be substantially self supporting and can, if desired, be brought into contact with a suitable conductive substrate during the imaging process. As is well known in the art, a uniform deposit of electrostatic charge of suitable polarity can be substituted for a conductive layer. Alternatively, a uniform deposit of electrostatic charge of suitable polarity on the exposed surface of the charge transport spacing layer can be substituted for a conductive layer to facilitate the application of electrical migration forces to the migration layer. This technique of "double charging" is well known in the art. The charge transport layer is of any effective thickness, typically from about 1 to about 25 microns, and preferably from about 2 to about 20 microns, although the thickness can be outside these ranges.

Charge transport molecules suitable for the charge transport layer are described in detail hereinabove. The specific charge transport molecule utilized in the charge transport layer of any given imaging member can be identical to or different from the charge transport molecule employed in the adjacent softenable layer. Similarly, the concentration of the charge transport molecule utilized in the charge transport spacing layer of any given imaging member can be identical to or different from the concentration of charge transport molecule employed in the adjacent softenable layer. When the charge transport material and film forming binder are combined to form the charge transport spacing layer, the amount of charge transport material used can vary depending upon the particular charge transport material and its compatibility (e.g. solubility) in the continuous insulating film forming binder. Satisfactory results have been obtained using between about 5 percent and about 50 percent based on the total weight of the optional charge transport spacing layer, although the amount can be outside this range. The charge transport material can be incorporated into the charge transport layer by techniques similar to those employed for the softenable layer.

The optional charge blocking layer can be of various suitable materials, provided that the objectives of the present invention are achieved, including aluminum oxide, polyvinyl butyral, silane and the like, as well as mixtures thereof. This layer, which is generally applied by known coating techniques, is of any effective thickness, typically from about 0.05 to about 0.5 micron, and preferably from about 0.05 to about 0.1 micron. Typical coating processes include draw bar coating, spray coating, extrusion, dip coating, gravure roll coating, wire-wound rod coating, air knife coating and the like.

The optional overcoating layer can be substantially electrically insulating, or have any other suitable properties. The overcoating preferably is substantially transparent, at least in the spectral region where electromagnetic radiation is used for imagewise exposure step in the imaging process. The overcoating layer is continuous and preferably of a thickness up to about 1 to 2 microns. More preferably, the overcoating has a thickness of between about 0.1 and about 0.5 micron to minimize residual charge buildup. Overcoating layers greater than about 1 to 2 microns thick can also be used. Typical overcoating materials include acrylic-styrene copolymers, methacrylate polymers, methacrylate copolymers, styrene-butylmethacrylate copolymers, butylmethacrylate resins, vinylchloride copolymers, fluorinated homo or copolymers, high molecular weight polyvinyl acetate, organosilicon polymers and copolymers, polyesters, polycarbonates, polyamides, polyvinyl toluene and the like. The overcoating layer generally protects the softenable layer to provide greater resistance to the adverse effects of abrasion during handling and imaging. The overcoating layer preferably adheres strongly to the softenable layer to minimize damage. The overcoating layer can also have abhesive properties at its outer surface which provide improved resistance to toner filming during toning, transfer, and/or cleaning. The abhesive properties can be inherent in the overcoating layer or can be imparted to the overcoating layer by incorporation of another layer or component of abhesive material. These adhesive materials should not degrade the film forming components of the overcoating and preferably have a surface energy of less than about 20 ergs/cm$^2$. Typical adhesive materials include fatty acids, salts and esters, fluorocarbons, silicones, and the like. The coatings can be applied by any suitable technique such as draw bar, spray, dip, melt, extrusion or gravure coating. It will be appreciated that these overcoating layers protect the imaging member before imaging, during imaging, after the members have been imaged.

Figure 2:
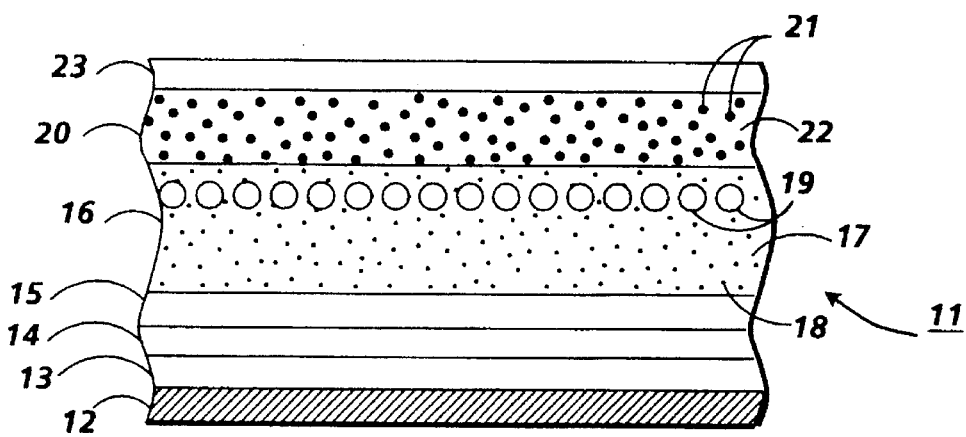
FIGS. 2 and 3 illustrate schematically infrared-sensitive migration imaging members which can be prepared by the apparatus and processes of the present invention.

As illustrated schematically in FIG. 2, migration imaging member 11 comprises in the order shown a substrate 12, an optional adhesive layer 13 situated on substrate 12, an optional charge blocking layer 14 situated on optional adhesive layer 13, an optional charge transport layer 15 situated on optional charge blocking layer 14, a softenable layer 16 situated on optional charge transport layer 15, said softenable layer 16 comprising softenable material 17, charge transport material 18, and migration marking material 19 situated at or near the surface of the layer spaced from the substrate, and an infrared or red light radiation sensitive layer 20 situated on softenable layer 16 comprising infrared or red light radiation sensitive pigment particles 21 optionally dispersed in polymeric binder 22. Alternatively (not shown), infrared or red light radiation sensitive layer 20 can comprise infrared or red light radiation sensitive pigment particles 21 directly deposited as a layer by, for example, vacuum evaporation techniques or other coating methods. Optional overcoating layer 23 is situated on the surface of imaging member 11 spaced from the substrate 12.

Figure 3:
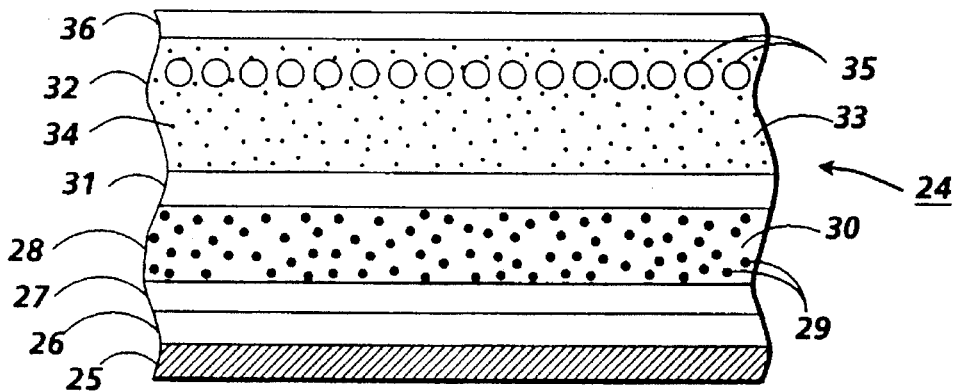

As illustrated schematically in FIG. 3, migration imaging member 24 comprises in the order shown a substrate 25, an optional adhesive layer 26 situated on substrate 25, an optional charge blocking layer 27 situated on optional adhesive layer 26, an infrared or red light radiation sensitive layer 28 situated on optional charge blocking layer 27 comprising infrared or red light radiation sensitive pigment particles 29 optionally dispersed in polymeric binder 30, an optional charge transport layer 31 situated on infrared or red light radiation sensitive layer 28, and a softenable layer 32 situated on optional charge transport layer 31, said softenable layer 32 comprising softenable material 33, charge transport material 34, and migration marking material 35 situated at or near the surface of the layer spaced from the substrate. Optional overcoating layer 36 is situated on the surface of imaging member 24 spaced from the substrate 25.

The infrared or red light sensitive layer generally comprises a pigment sensitive to infrared and/or red light radiation. While the infrared or red light sensitive pigment may exhibit some photosensitivity in the wavelength to which the migration marking material is sensitive, it is preferred that photosensitivity in this wavelength range be minimized so that the migration marking material and the infrared or red light sensitive pigment exhibit absorption peaks in distinct, different wavelength regions. This pigment can be deposited as the sole or major component of the infrared or red light sensitive layer by any suitable technique, such as vacuum evaporation or the like. An infrared or red light sensitive layer of this type can be formed by placing the pigment and the imaging member comprising the substrate and any previously coated layers into an evacuated chamber, followed by heating the infrared or red light sensitive pigment to the point of sublimation. The sublimed material recondenses to form a solid film on the imaging member. Alternatively, the infrared or red light sensitive pigment can be dispersed in a polymeric binder and the dispersion coated onto the imaging member to form a layer. Examples of suitable red light sensitive pigments include perylene pigments such as benzimidazole perylene, dibromoanthranthrone, crystalline trigonal selenium, beta-metal free phthalocyanine, azo pigments, and the like, as well as mixtures thereof. Examples of suitable infrared sensitive pigments include X-metal free phthalocyanine, metal phthalocyanines such as vanadyl phthalocyanine, chloroindium phthalocyanine, titanyl phthalocyanine, chloroaluminum phthalocyanine, copper phthalocyanine, magnesium phthalocyanine, and the like, squaraines, such as hydroxy squaraine, and the like as well as mixtures thereof. Examples of suitable optional polymeric binder materials include polystyrene, styrene-acrylic copolymers, such as styrene-hexylmethacrylate copolymers, styrene-vinyl toluene copolymers, polyesters, such as PE-200, available from Goodyear, polyurethanes, polyvinylcarbazoles, epoxy resins, phenoxy resins, polyamide resins, polycarbonates, polyterpenes, silicone elastomers, polyvinylalcohols, such as Gelvatol 20-90, 9000, 20-60, 6000, 20-30, 3000, 40-20, 40-10, 26-90, and 30-30, available from Monsanto Plastics and Resins Co., St. Louis, Mo., polyvinylformals, such as Formvar 12/85, 5/95E, 6/95E, 7/95E, and 15/95E, available from Monsanto Plastics and Resins Co., St. Louis, Mo, polyvinylbutyrals, such as Butvar B-72, B-74, B-73, B-76, B-79, B-90, and B-98, available from Monsanto Plastics and Resins Co., St. Louis, Mo, Zeneca resin A622, available from Zeneca Colours, Wilmington, Del., and the like as well as mixtures thereof. When the infrared or red light sensitive layer comprises both a polymeric binder and the pigment, the layer typically comprises the binder in an amount of from about 5 to about 95 percent by weight and the pigment in an amount of from about 5 to about 95 percent by weight, although the relative amounts can be outside this range. Preferably, the infrared or red light sensitive layer comprises the binder in an amount of from about 40 to about 90 percent by weight and the pigment in an amount of from about 10 to about 60 percent by weight. Optionally, the infrared sensitive layer can contain a charge transport material as described herein when a binder is present; when present, the charge transport material is generally contained in this layer in an amount of from about 5 to about 30 percent by weight of the layer. The optional charge transport material can be incorporated into the infrared or red light radiation sensitive layer by any suitable technique. For example, it can be mixed with the infrared or red light radiation sensitive layer components by dissolution in a common solvent. If desired, a mixture of solvents for the charge transport material and the infrared or red light sensitive layer material can be employed to facilitate mixing and coating. The infrared or red light radiation sensitive layer mixture can be applied to the substrate by any conventional coating process. Typical coating processes include draw bar coating, spray coating, extrusion, dip coating, gravure roll coating, wire-wound rod coating, air knife coating, and the like. An infrared or red light sensitive layer wherein the pigment is present in a binder can be prepared by dissolving the polymer binder in a suitable solvent, dispersing the pigment in the solution by ball milling, coating the dispersion onto the imaging member comprising the substrate and any previously coated layers, and evaporating the solvent to form a solid film. When the infrared or red light sensitive layer is coated directly onto the softenable layer containing migration marking material, preferably the selected solvent is capable of dissolving the polymeric binder for the infrared or red sensitive layer but does not dissolve the softenable polymer in the layer containing the migration marking material. One example of a suitable solvent is isobutanol with a polyvinyl butyral binder in the infrared or red sensitive layer and a styrene/ethyl acrylate/acrylic acid terpolymer softenable material in the layer containing migration marking material. The infrared or red light sensitive layer can be of any effective thickness. Typical thicknesses for infrared or red light sensitive layers comprising a pigment and a binder are from about 0.05 to about 2 microns, and preferably from about 0.1 to about 1.5 microns, although the thickness can be outside these ranges. Typical thicknesses for infrared or red light sensitive layers consisting of a vacuum-deposited layer of pigment are from about 200 to about 2,000 Angstroms, and preferably from about 300 to about 1,000 Angstroms, although the thickness can be outside these ranges.

Figure 4:
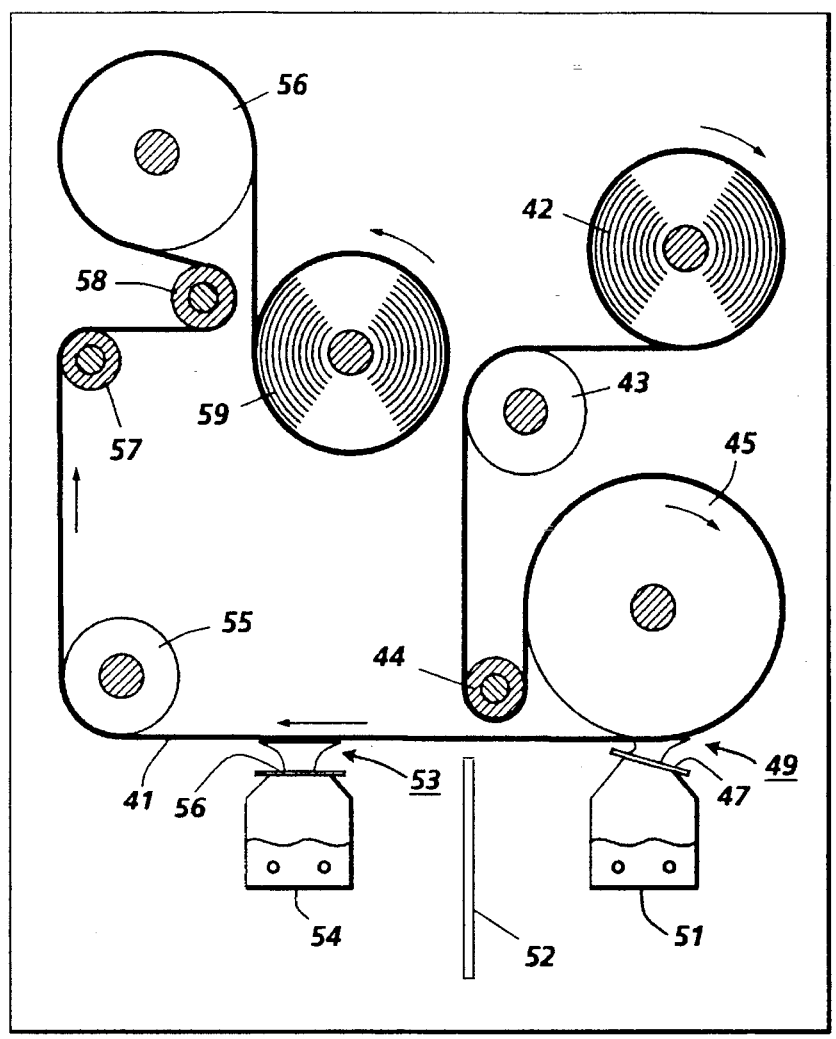
FIG. 4 illustrates schematically an apparatus and process according to the present invention.

Migration imaging members are made with the apparatus and according to the process of the present invention as follows. As illustrated schematically in FIG. 4, a migration imaging member 41 comprising a supporting substrate having thereon a softenable layer (and, if desired, with optional additional layers situated between the supporting substrate and the softenable layer, such as an infrared or red-light sensitive layer, a charge blocking layer, or the like) is transported from a supply 42 around a portion of the periphery of heated member 45 (which may be a mandrel, a roller, a flat surface, or any other suitable member and in FIG. 4 is depicted as a rotatably mounted roll) into contact at a high impingement rate with a stream of vapors of migration imaging material moving through apertures (not shown in FIG. 4) of first surface 47 on crucible 51 into a first deposition zone 49. In the specific embodiment illustrated in FIG. 4, the migration imaging member 41 passes from supply 42 around optional first rigid member 43 (which may be a mandrel, a roller, a flat surface, or the like and is depicted in FIG. 4 as a rotatable roller), which is rigidly mounted in place, and then around optional first floating member 44 (which may be a mandrel, a roller, a flat surface, or the like and is depicted in FIG. 4 as a rotatable roller), which is mounted so that each end can move independently of the other in a vertical direction, thereby enabling intimate and uniform contact between migration imaging member 41 and heated member 45. Preferably, optional first floating member 44 is situated with respect to heated member 45 so as to maximize the wrap angle, i.e., so that as much as possible of the surface of heated member 45 is in contact with migration imaging member 41. If desired, migration imaging member 41 can pass first around a first floating member and then around a first rigid member. The stream of migration imaging material in first deposition zone 49 is generated in a crucible 51 heated by any suitable method (not shown in FIG. 4), such as resistive heating, inductive heating, microwave heating, the presence of one or more heating rods or coils within the crucible bed containing the evaporatable material, or the like to vaporize the migration imaging material. The first surface 47 on crucible 51 preferably is situated at an angle to enable concentration of the vapors generated in first deposition zone 49 to the area near or on heated member 45. Any angle with respect to the horizontal or vertical can, however, be selected for first surface 47, with the optimum angle depending on the specific softenable material and migration marking material selected. An optimum angle enables deposition of the migration marking material on the softenable material when the softenable material has reached a viscosity to result in the desired particle size and formation. The migration imaging member 41 thereafter can optionally be transported through a second deposition zone 53, in which it is exposed at a low impingement rate to vapors of migration imaging material generated in optional second crucible 54 optionally equipped with second surface 56 having openings (not shown in FIG. 4), which causes the migration imaging material particles deposited in the first deposition zone 49 to grow more slowly in size, thereby maintaining a narrow size distribution and achieving a high surface packing density. The second surface 56 on optional second crucible 54 preferably is situated substantially parallel to migration imaging member 41 as it passes between first crucible 51 and cooling member 55 to enable vapors generated in second deposition zone 53 to contact this entire portion of migration imaging member 41. Optionally, if desired, first crucible 51 can be further isolated from optional second crucible 54 by a baffle 52. The migration imaging member 41 is then transported around at least a portion of the periphery of cooling member 55 (which may be a mandrel, a roller, a flat surface, or the like and is depicted in FIG. 4 as a rotatable roller) and onto takeup 59. If desired, optional additional cooling member 56 (which may be a mandrel, a roller, a flat surface, or the like and is depicted in FIG. 4 as a rotatable roller) and further cooling members (not shown) may be utilized. In the specific embodiment illustrated in FIG. 4, migration imaging member 41 passes from cooling member 55 around optional second floating member 57 (which may be a mandrel, a roller, a flat surface, or the like and is depicted in FIG. 4 as a rotatable roller), which is mounted so that each end can move independently of the other in a vertical direction, and then around optional second rigid member 58 (which may be a mandrel, a roller, a flat surface, or the like and is depicted in FIG. 4 as a rotatable roller), which is rigidly mounted in place, and subsequently around optional additional cooling member 56 and onto takeup 59. If desired, migration imaging member 41 can pass first around a second floating member and then around a second rigid member. While any suitable or desired arrangement of the supply, takeup, migration imaging member, heated member, cooling member, and crucible(s) can be employed, it is desirable to situate the apparatus components with respect to each other in a manner that enables a compact and space-efficient arrangement within the vacuum coating apparatus, thereby enabling shorter vacuum pumpdown times for the vacuum coating apparatus.

The heated member 45 may be heated by any suitable technique including infrared lamps, resistance elements, high boiling point fluids and the like. Generally, the temperature of the heated member 45 should be sufficient to heat the softenable layer and reduce the viscosity of the softenable layer to between about $10^3$ poises to about $10^9$ poises. Various factors affect the temperature to which the heated member 45 should be heated. Factors to be considered in the selection of the appropriate temperature of the heated member 45 include the specific softenable material, the specific migration marking particle material, the rate of deposition of the migration material, and the like to achieve formation of a monolayer of migration imaging material particles embedded below the surface of the softenable layer. When a softenable layer of a copolymer containing about 80 mole percent styrene and about 20 mole percent hexylmethacrylate having a molecular weight of about 50,000 is vacuum coated with selenium, preferred temperatures are from about 95° to about 115° C., and more preferably about 103° C., to enable maximum optical density of the resulting final migration imaging member, although temperatures outside this range can also be employed.

The cooling member 55 may be cooled to any temperature sufficient to prevent blocking of the softenable material in the softenable layer, which for the purposes of the present invention is transfer of the softenable layer to the back or bottom surface of the imaging member (i.e., the surface of the imaging member not originally coated with the softenable layer) when the migration imaging member is wound onto itself in the takeup. In the specific embodiment illustrated in FIG. 4, cooling member 55 is cooled to a temperature sufficient to prevent transfer of the softenable layer to members 57 and 58 (room temperature, for example) and optional additional cooling member 56 is cooled to a temperature sufficient to enable winding of migration imaging member 41 onto itself under tension in takeup 59 without adhering to itself (−15° C., for example). In some embodiments and with some materials, cooling the first cooling member to temperatures below 0° C. may be undesirable, and additional cooling members are preferred in these instances to cool to temperatures below 0° C. The specific blocking temperature, of course, depends upon the particular softenable material employed in the softenable layer. Cooling to temperatures below room temperature can be by any suitable technique, such as cooling with ice water or the like.

Although the tension of the migration imaging member 41 during the coating process does not appear critical, it should be sufficient to provide good contact with both heated member 45 and cooling member 55 without stretching the substrate. The migration imaging member 41 is normally transported over the heated member 45 and the cooling member 55 and with a supporting substrate positioned between the softenable layer and heated member 45 and the cooling member 55.

Figure 6A:
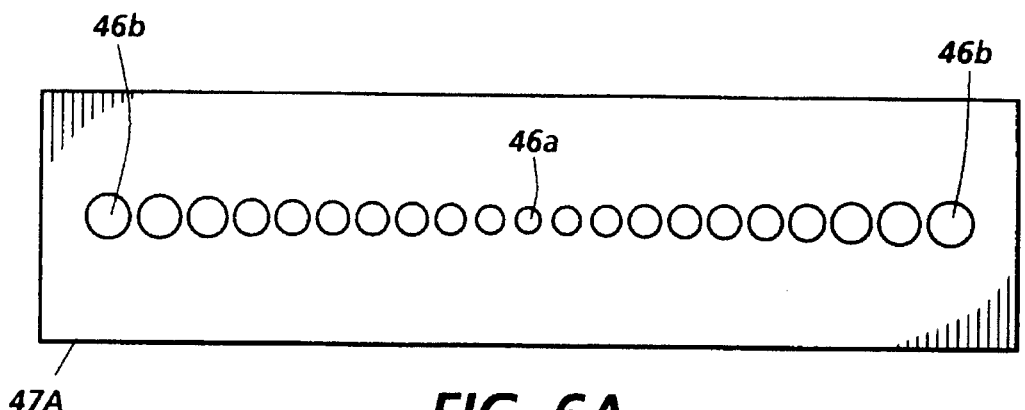
FIG. 6 illustrates schematically different aperture arrangements suitable for use with a crucible in an apparatus and process of the present invention.
Figure 6B:
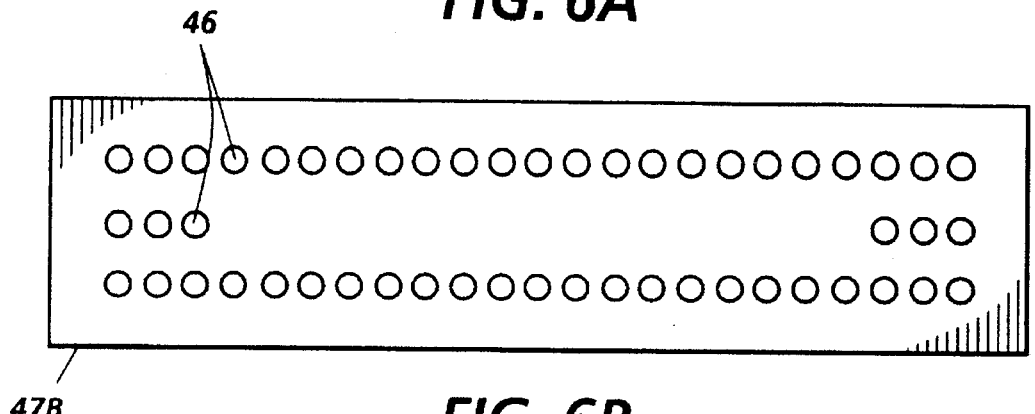
Figure 6C:
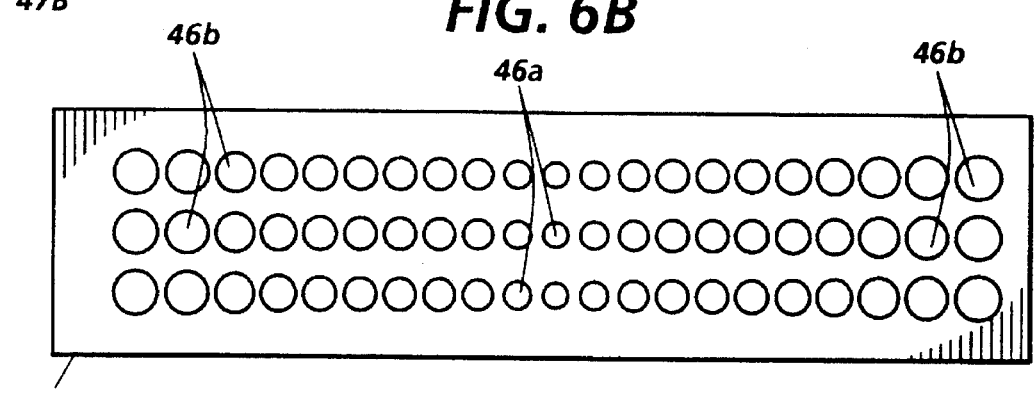
Figure 6D:
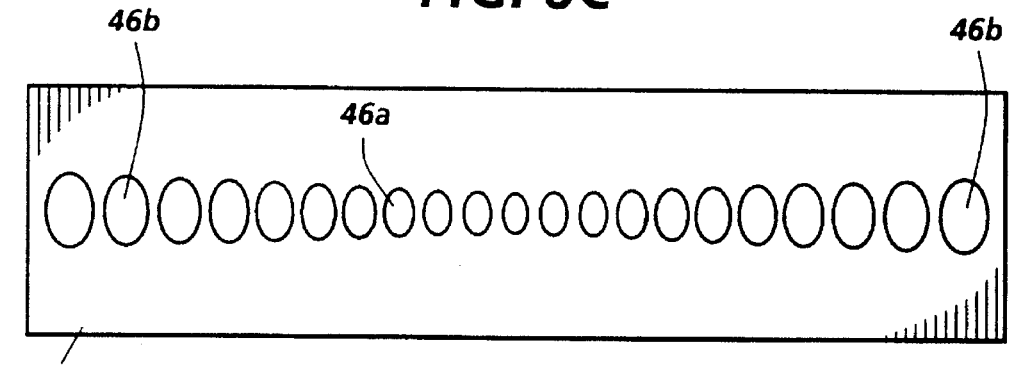

As illustrated schematically in FIGS. 6A through 6D (not drawn to scale), apertures 46 of first surface 47 preferably are either sized so that apertures 46a, situated near the center of surface 47, are smaller than apertures 46b, situated near the edges of surface 47, as illustrated schematically in FIGS. 6A, 6C, and 6D, or are more numerous, per unit of area, in the surface 47 near the edges than they are near the center of the surface, as illustrated schematically in FIG. 6B. In either instance, it is preferred that the aperture area in the surface is greater at the lateral marginal edges (i.e., the edges parallel to the path of movement of the migration imaging member 41 during the vacuum coating process) than at the medial portion of the surface; the surface area of the solid portion of crucible surface 47 itself thus is greater at the medial portion thereof than at the lateral marginal edges thereof. The increased size or number of apertures 46 in the surface 47 at the ends as compared to the center promotes more uniform deposition of migration imaging material particles across the width of migration imaging member 41. Because of various factors such as speed of the imaging member, distance of the surface 47 to the surface of the softenable layer, distance between the apertures 46 and the source of the migration imaging material vapors, and the like, the specific size and number of the apertures 46 should be determined by trial and error, keeping in mind that uniformity of deposition of the migration imaging material is affected by the size and number of the apertures 46. As illustrated schematically in FIG. 6A, a surface 47A having a single row of apertures, wherein apertures 46a, situated near the center of surface 47A, are smaller than apertures 46b, situated near the edges of surface 47A, is suitable. As illustrated schematically in FIG. 6B, a surface 47B having a multiplicity of rows of apertures 46, wherein the apertures 46 are of substantially uniform size but are more numerous per unit of area of the surface near the edges of surface 47B than near the center of the surface, is also suitable. Illustrated schematically in FIG. 6C is a surface 47C which has a multiplicity of rows of apertures, wherein the apertures of openings per unit area of surface 47C remains substantially uniform between the center and the edges of surface 47C, but the diameter of apertures 46a, situated near the center of surface 47C, are smaller than apertures 46b, situated near the edges of surface 47C. This embodiment enables higher evaporation rates and higher production speeds compared to other illustrated embodiments. As illustrated schematically in FIG. 6D, the apertures 46a and 46b in a surface such as 47D need not be uniformly round, but may also be rectangular, oval, or of any other desired shape. The apertures 46 in surface 47 remain substantially uniform in size with respect to each other throughout the heating and evaporation process; the structural integrity of surface 47 throughout the evaporation process thus enables highly uniform evaporation coating results.

The heated crucible 51 is the source of the concentrated vapors of migration imaging material for the first deposition zone. As illustrated schematically in FIG. 5, crucible 51 is a container of any desired shape or size for holding the vacuum evaporatable material 60 to be evaporated therefrom, such as a migration material such as selenium or the like. Crucible 51 can be heated by any desired method, such as resistive heating, inductive heating, microwave heating, the presence of one or more heating rods or coils within the crucible bed containing the evaporatable material, or the like. In the specific embodiment illustrated in FIG. 5, crucible 51 is resistively heated by passing current therethrough and accordingly can be of any material suitable for resistive heating to the desired temperature which does not react with the material to be evaporated at the evaporation temperature and under the atmospheric pressure conditions (typically vacuum) employed for the evaporation process. Examples of suitable materials for vacuum evaporation of selenium include stainless steels, non-stainless steels, conductive ceramics, molybdenum, titanium, tantalum, tungsten, and the like.

Figure 7:
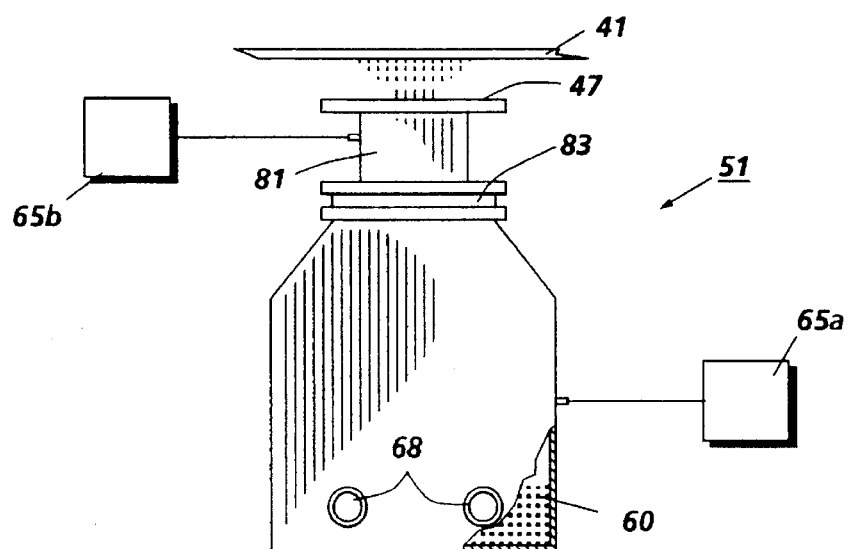
FIG. 7 illustrates schematically another crucible for use in the apparatus and process of the present invention.
Figure 5:
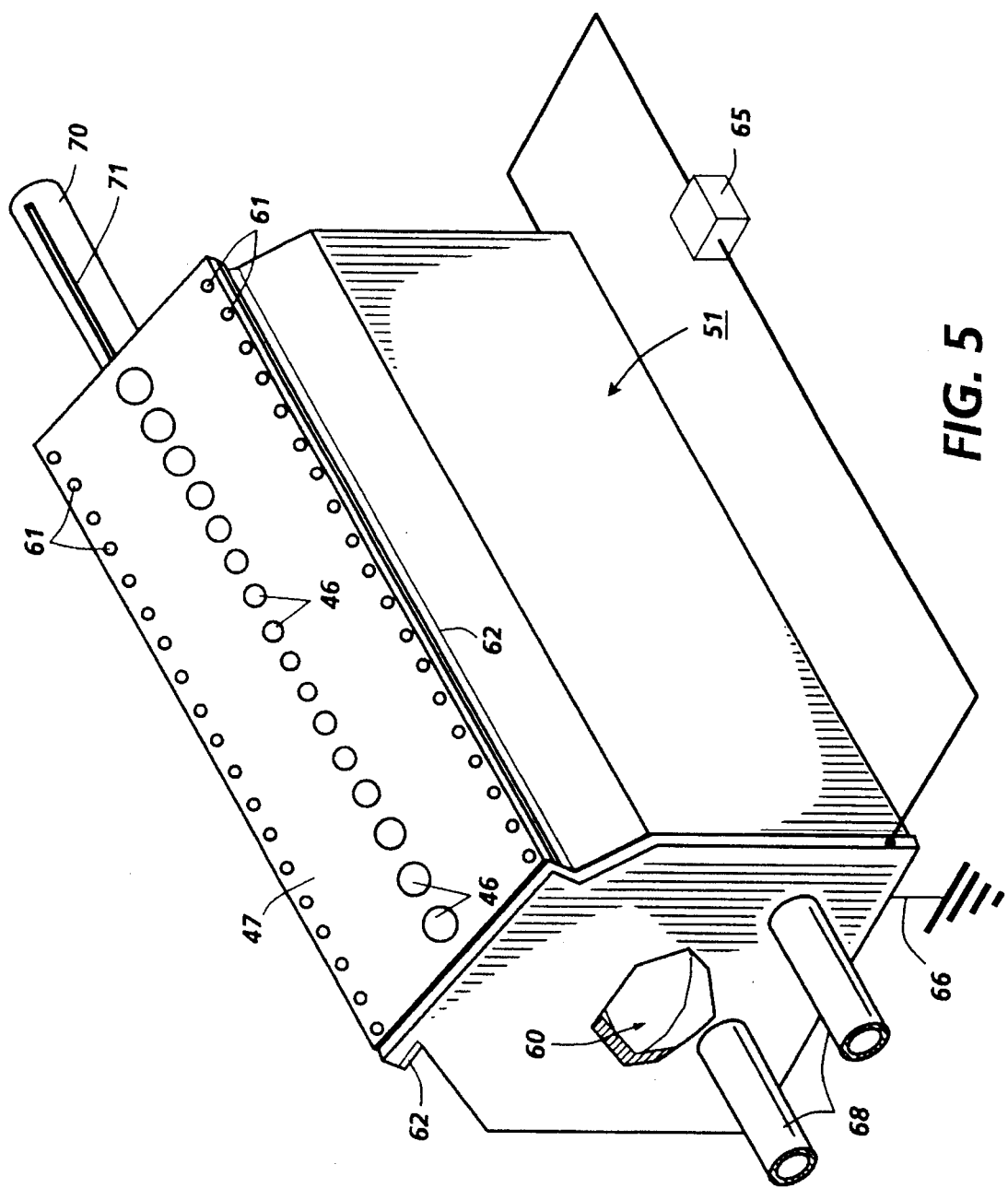
FIG. 5 illustrates schematically a crucible for use in the apparatus and process of the present invention.

Surface 47 preferably is removably attached to crucible 51 to enable easy replacement if damaged, or to substitute one surface for another with a different hole configuration if production conditions such as speed of evaporation are changed, although if desired it can be an integral portion of crucible 51. When resistive heating is employed as illustrated in FIG. 5, surface 47 is also of a material suitable for resistive heating to the desired temperature which does not react with the material to be evaporated at the evaporation temperature and under the atmospheric pressure conditions employed for the evaporation process. The surface 47 can be either of the same material as crucible 51 or of a material different from crucible 51, although use of the same material for both surface 47 and crucible 51 is preferred. In one embodiment of the invention as illustrated in FIG. 5, surface 47 is removably attached to crucible 51 in a manner that enables intimate conductive contact between crucible 51 and surface 47 so that when current is applied to crucible 51, current flows through surface 47 either at the same rate or at a higher rate as it flows through crucible 51. For example, in the embodiment illustrated in FIG. 5, crucible 51 and surface 47 are both of stainless steel and surface 47 is bolted onto crucible 51 with stainless steel screws 61 and a clamp plate 63 (which could, if desired, be replaced with individual nuts for each screw). During the initial heating process, when a vacuum evaporatable material 60 such as selenium to be evaporated is situated inside crucible 51, surface 47 may initially be at temperatures significantly hotter than the body of crucible 51, since surface 47 is not in contact with material 60, and contact with material 60 slows heating of crucible 51. When the desired evaporation temperature is reached, however, the current passing through crucible 51 is usually reduced and the temperature of surface 47 may fall to that of crucible 51. It is important, however, that surface 47 be at either the same temperature as crucible 51 or at a temperature greater than that of crucible 51 during the vacuum evaporation process. If the temperature of surface 47 falls below that of crucible 51, material 60 may condense on surface 47, which results in blockage of apertures 46, thereby changing the diameters of apertures 46 throughout the vacuum evaporation process and leading to nonuniform results, and also wasting material 60 and requiring a cleaning step subsequent to the vacuum evaporation process. Alternatively, as illustrated schematically in FIG. 7, surface 47 and crucible 51 can each be coupled to independent heat sources, thereby enabling independent control of the temperature of and within crucible 51 and the temperature of surface 47. In either event, however, surface 47 is maintained at either the same temperature as crucible 51 or at a temperature greater than that of crucible 51 during the vacuum evaporation process. Specifically, FIG. 7 illustrates schematically in side view a crucible 51 having an optional chimney extension 81 with surface 47 thereon, with a layer of electrically insulating material 83 situated between crucible 51 and surface 47, wherein crucible 51 is coupled to first heat source 65a and surface 47 is coupled to second heat source 65b. Advantages of this specific embodiment include reduced evaporation times and lowered temperature requirements for the heating of the selenium within the crucible.

In the embodiment illustrated in FIG. 5, crucible 51 is connected to power source 65, which may supply either alternating current or direct current, and also connected to ground 66. The current passed through crucible 51 and surface 47 is sufficient to heat material 60 to a temperature desirable for vacuum evaporation. For example, when material 60 is selenium, currents of from about 1000 Amperes to about 1,500 Amperes are typical, with the voltage depending on the length of the crucible. For vacuum evaporation of selenium to form migration imaging members, typical current densities are from about 600 to about 1,700 Amperes per square inch, and preferably from about 700 to about 1,000 Amperes per square inch, although the current density can be outside these ranges.

In the embodiment illustrated in FIG. 5, crucible 51 is equipped with optional cooling element 68, which passes under or through material 60 to enable cooling of the crucible at the end of the vacuum evaporation process. In the illustrated embodiment, cooling element 68 is a coiled pipe which enters and exits crucible 51 at the same end, so that upon cooling, when the cooling element may shrink by as much as ½ inch in a crucible 6 feet long, the cooling element does not cause buckling or deformation of the still-hot crucible. Any suitable or desired process may be employed to cool the crucible, such as passing cool water through optional cooling element 68, or the like. Optional cooling element may be of either the same material as crucible 51 or of a different material, and may be either electrically conducting or electrically insulating, although cold spots may be minimized by the use of a conductive material. If desired, a cooling element can be insulated and can also function as a heating element. In the illustrated embodiment, optional cooling element 68 enters and exits crucible 51 at the same end at which crucible 51 is connected to ground 66.

Crucible 51 preferably is mounted within the vacuum evaporation chamber (not shown) in a manner that enables the crucible to expand and shrink upon heating and cooling without distorting or impairing its position with respect to migration imaging member 41. Preferably, crucible 51 is mounted on supports which are electrically insulative at at least the end opposite to that connected to ground 66 to prevent current and heat from being conducted from crucible 51 to the vacuum evaporation chamber. Thermal insulation at both ends of the crucible may be preferred, and may be accomplished by any desired method and materials, such as ceramic insulators, nonmetallic thermosetting plastics, glass cloths, laminated resins, or the like.

Optionally, as illustrated in FIG. 5, one wall of crucible 51 may be equipped with an opening to enable loading of the crucible with material 60 without the need to remove surface 47. As shown in FIG. 5, loading tube 70 enters crucible 51 through an opening (not shown) in crucible 51. Loading tube 70 in this embodiment is a cylindrical tube having an elongated opening 71. Material 60 is placed in loading tube 70 with elongated opening being situated so as to prevent material 60 from falling out of loading tube 70. Thereafter, loading tube 70 is inserted into the opening in crucible 51 and turned so that material 60 falls from loading tube 70 into crucible 51 through opening 71. Subsequent to use and prior to heating, loading tube 70 is removed and the opening through which loading tube 70 is introduced into crucible 51 is equipped with a cap (not shown).

While in the illustrated embodiment crucible 51 is shown with flat rectangular walls, the invention is not limited to this configuration, and any desired or suitable configuration can be employed, including curved walls and/or curved bottom, or the like. Similarly, surface 47 can be either flat or curved and can be of any desired shape.

During deposition, the migration imaging material in the crucible should be maintained at a temperature of about 230° C. to about 375° C. Generally, temperatures less than about 230° C. result in impingement rates that are too low. Temperatures above about 375° C. require excessive web speeds and present difficulties in adequately softening the softenable layer. This temperature may be regulated by any suitable means such as by controlling the heating of crucible 51.

The speed of the migration imaging member 41 through the first deposition zone 49 and optional second deposition zone 53 may be as high as about 50 feet per minute or more, the speed depending upon the heating capabilities of the system. The speed of the migration imaging member 41 affects the size of the apertures 46 selected for surface 47 as well as the impingement rate of migration material needed in the first deposition zone 49. More specifically, when the speed of the migration imaging member 41 is increased, the size of the apertures 46 must also be increased and/or the temperature of the crucible 51 must also be increased. Conversely, when the speed of the migration imaging member 41 is reduced, the size of the apertures 46 for surface 47 and/or the temperature of the crucible 51 must also be reduced.

Generally, excellent results may be achieved in the first deposition zone by maintaining therein a high selenium or selenium alloy vapor impingement rate between about 0.2 micron per second and about 1.4 micron per second at web speeds between about 10 feet per minute and about 50 feet per minute. The rate of impingement is equal to the amount of migration imaging material, measured as the thickness of a theoretical continuous film based on the total volume of the particles, deposited in a given area divided by the time the given area is exposed to the imaging material vapors. The measurements are made near the centerline of the migration imaging member 41. The rate of impingement calculations are based in the assumption that the majority of material deposited remains in the web and does not reevaporate at the web temperature employed. This assumption is considered substantially accurate and appropriate at the temperatures utilized. See D. Buckley, G. Brown, and F. Belli, *Surface Technology*, vol. 12, p. 257 (1981) for further details as to the rate of reevaporation, the entire disclosure thereof being incorporated herein by reference. The temperature of the crucible is adjusted experimentally to obtain the desired rate of impingement.

When an optional second crucible and second deposition zone are employed, the deposition of the migration imaging material in the first deposition zone should be sufficient to provide a monolayer of migration imaging material particles having an optical density of at least about 1.5 (i.e., about 1.5 optical density units greater than the optical density of the substrate and softenable material prior to deposition of the migration imaging material). Generally, an optical density of less than about 1.5 renders a process less practical because a relatively large amount of material must be deposited at a relatively low rate in the second deposition zone downstream thereby requiring either a very extended zone or a low throughput speed. Since a maximum optical density of only about 1.7 can be achieved in the first deposition zone regardless of the number of crucibles utilized, a single crucible source for the steam of vapors of migration imaging material has been found to be quite satisfactory. Moreover, when deposition in the first deposition zone is continued after an optical density of about 1.7 is achieved, the optical density begins to decline. Since the decline of optical density in the first deposition zone is undesirable, the migration imaging member 41 should be removed from the first deposition zone prior to a substantial dropoff in optical density. The expression "substantial dropoff in optical density" is intended to mean more than a value of about 0.05. An optical density dropoff of more than about 0.05 renders the process less effective and increases the number of undesirable small migration imaging material particles in the final imaging member and reduces the surface packing density. Variables such as web speed, temperature of the crucible, distance of the crucible from the web, size of the apertures in the crucible surface and the like described above and hereinafter, are adjusted experimentally to ensure timely termination of deposition prior to substantial dropoff in optical density in the first deposition zone. This optical density may be determined by measurement of migration imaging members made during set-up experiments.

The deposited particles in the first deposition zone have an average particle size between about 0.2 micron and about 0.3 micron. These deposited particles are generally formed in the first deposition zone in less than about 1 second.

The entire deposition process preferably is conducted in a chamber at a vacuum of better than about $10^{-2}$ Torr because at pressures more than about this value, the selenium or selenium alloy vapor tends to form particles (i.e. smoke) prior to reaching the heated softenable layer. Excellent results have been achieved with a vacuum of about $10^{-4}$ Torr.

The deposition of a stream of concentrated vapors of the migration imaging material at a high impingement rate in a first deposition zone followed by exposure of the deposited migration imaging material particles to migration imaging material vapors at a lower impingement rate in a second deposition zone while the softenable layer remains warm allows larger spheres of the deposited migration imaging material particles to form, while maintaining a narrow size distribution and achieving a high surface packing density, thereby providing a migration imaging member having improved contrast density.

Specific embodiments of the invention will now be described in detail. These examples are intended to be illustrative, and the invention is not limited to the materials, conditions, or process parameters set forth in these embodiments. All parts and percentages are by weight unless otherwise indicated.

EXAMPLE I

A migration imaging member was prepared as follows. A solution for the softenable layer was prepared by dissolving about 84 parts by weight of a terpolymer of styrene/ethylacrylate/acrylic acid (prepared as disclosed in U.S. Pat. No. 4,853,307, the disclosure of which is totally incorporated herein by reference) and about 16 parts by weight of N,N'-diphenyl-N,N'-bis(3"-methylphenyl)-(1,1'-biphenyl)-4,4'-diamine (prepared as disclosed in U.S. Pat. No. 4,265,990, the disclosure of which is totally incorporated herein by reference) in about 450 parts by weight of toluene. N,N'-diphenyl-N,N'-bis(3"-methylphenyl)-(1,1'-biphenyl)-4,4'-diamine is a charge transport material capable of transporting positive charges (holes). The resulting solution was coated by a solvent extrusion technique onto a 3 mil thick polyester substrate (Melinex 442, obtained from Imperial Chemical Industries (ICI), aluminized to 20 percent light transmission), and the deposited softenable layer was allowed to dry at about 115° C. for about 2 minutes, resulting in a dried softenable layer with a thickness of about 4 microns. The migration imaging member thus formed was wound onto a supply roll and incorporated into a vacuum coating apparatus as illustrated in FIGS. 4 and 5, wherein optional second crucible 54 and optional baffle 52 were absent. Heated roll 45 was heated to a temperature of 115° C. to lower the viscosity of the exposed surface of the softenable layer on the migration imaging member to about $5 \times 10^3$ poises in preparation for the deposition of marking material. A thin layer of particulate vitreous selenium was then applied by vacuum deposition in the vacuum chamber maintained at a vacuum of about $2 \times 10^{-4}$ Torr. Crucible 51 was 24 inches in length, 4 inches in width, and 4.9 inches at its tallest point in height, with surface 47 being angled toward heated roll 45 at an angle of 12° with respect to the plane of the migration imaging member 41 as it passed crucible 51. Imaging member 41 passed crucible 51 at a speed of 10 feet per minute. Crucible 51 was heated to a temperature of 340° C. Surface 47 was equipped with a single row of round apertures as illustrated in FIG. 6A. A total of 292 apertures were present in surface 47, with the central 250 apertures (46a) having diameters of 0.040 inch ±0.0005 inch. Thereafter, the diameters of the apertures increased with increasing distance from the center of the surface, and the outermost apertures (46b) had diameters of 0.055 inch ±0.0005 inch. The actual diameters of all apertures were as shown in the table below, with #1 representing the two centermost apertures in plate 47, #2 representing the two apertures adjacent the two centermost apertures, and the like. Cooling roll 55 was maintained at room temperature (about 25° C.) and optional additional cooling roll 56 was maintained at −15° C. A reddish monolayer of selenium particles embedded below the surface of the copolymer layer was formed. The optical density of the migration imaging member thus formed was measured at points across the width of the coated web corresponding to the apertures closest in proximity to the web at those points, with the results shown in the table below. All optical density measurements were done using a MacBeth TR927 densitometer. The background values attributable to the substrate were subtracted from the values shown in the table. The blue setting corresponds to a Wratten No. 47 filter and the red setting corresponds to a Wratten No. 25 filter. As the results indicate, optical density was uniform across the web ±0.01 optical density units in the red and ±0.02 optical density units in the blue.

| Aperture # | Diameter (inches) | O.D. (red) | O.D. (blue) |
|---|---|---|---|
| 1–126 | 0.040 | 0.45 | 1.58 |
| 127–131 | 0.041 | 0.46 | 1.59 |
| 132–135 | 0.042 | 0.45 | 1.60 |
| 136–138 | 0.043 | 0.44 | 1.60 |
| 139–140 | 0.0453 | 0.46 | 1.61 |
| 141 | 0.0465 | 0.46 | 1.60 |
| 142 | 0.0472 | 0.45 | 1.62 |
| 143 | 0.0492 | 0.46 | 1.62 |
| 144 | 0.052 | 0.46 | 1.62 |
| 145 | 0.0531 | 0.46 | 1.62 |
| 146 | 0.055 | 0.46 | 1.62 |

EXAMPLE II

The process of Example I was repeated except that crucible 51 was heated to a temperature of 310° C. and the apertures 46a and 46b in surface 47 had diameters as indicated in the table below ±0.0005 inch. As the results indicate, optical density was uniform across the web ±0.015 optical density units in the red and ±0.02 optical density units in the blue.

| Aperture # | Diameter (inches) | O.D. (red) | O.D. (blue) |
|---|---|---|---|
| 1–126 | 0.055 | 0.46 | 1.58 |
| 127–131 | 0.0571 | 0.45 | 1.58 |
| 132–135 | 0.0591 | 0.47 | 1.59 |
| 136–138 | 0.0595 | 0.44 | 1.61 |

-continued

| Aperture # | Diameter (inches) | O.D. (red) | O.D. (blue) |
| --- | --- | --- | --- |
| 139–140 | 0.0635 | 0.45 | 1.60 |
| 141 | 0.065 | 0.46 | 1.62 |
| 142 | 0.0669 | 0.46 | 1.62 |
| 143 | 0.0689 | 0.46 | 1.62 |
| 144 | 0.073 | 0.46 | 1.62 |
| 145 | 0.076 | 0.46 | 1.62 |
| 146 | 0.0785 | 0.46 | 1.62 |

EXAMPLE III

The process of Example II was repeated except that imaging member 41 passed crucible 51 at a speed of 30 feet per minute and except that there were three rows of apertures in surface 47 instead of one row, with each row having 292 apertures, and the apertures in each row were of the same diameters as set forth in the table in Example II. Similar results were obtained, namely the optical density was uniform across the web ±0.015 optical density units in the red and ±0.02 optical density units in the blue.

EXAMPLE IV

The imaging members prepared in Examples I, II, and III are each uniformly negatively charged to a surface potential of about −140 Volts with a corona charging device and are subsequently optically exposed by placing a test pattern mask comprising a silver halide image in contact with the imaging members and exposing the members to blue light of 480 nanometers through the mask for a period of about 5 seconds. The exposed imaging members are then developed by heating them with an aluminum heating block in contact with the polyester substrates at temperatures of from about 85° to about 100° C. for about 5 seconds. Sign-retaining images corresponding to the image on the test pattern mask will subsequently be visible in the developed imaging members.

EXAMPLE V

Three infrared-sensitive migration imaging members are prepared as follows. A solution for the softenable layer is prepared by dissolving about 84 parts by weight of a terpolymer of styrene/ethylacrylate/acrylic acid (prepared as disclosed in U.S. Pat. No. 4,853,307, the disclosure of which is totally incorporated herein by reference) and about 16 parts by weight of N,N'-diphenyl-N,N'-bis(3"-methylphenyl)-(1,1'-biphenyl)-4,4'-diamine (prepared as disclosed in U.S. Pat. No. 4,265,990, the disclosure of which is totally incorporated herein by reference) in about 450 parts by weight of toluene. N,N'-diphenyl-N,N'-bis(3"-methylphenyl)-(1,1'-biphenyl)-4,4'-diamine is a charge transport material capable of transporting positive charges (holes). The resulting solution is coated by a solvent extrusion technique onto three 3 mil thick polyester substrates (Melinex 442, available from Imperial Chemical Industries (ICI), aluminized to 20 percent light transmission), and the deposited softenable layers are allowed to dry at about 115° C. for about 2 minutes, resulting in dried softenable layers with thicknesses of about 2 microns. Reddish monolayers of selenium particles are then vacuum deposited on the copolymer layers, with a first migration imaging member being vacuum coated as described in Example I, a second migration imaging member being vacuum coated as described in Example II, and a third migration imaging member being vacuum coated as described in Example III. The migration imaging members coated with monolayers of selenium particles are then treated as follows. A pigment dispersion is prepared by ball milling for 24 hours a mixture comprising 10.6 parts by weight solids in a solvent (wherein the solvent comprises 40 percent by weight 2-propanol and 60 percent by weight deionized water), wherein the solids comprises 20 percent by weight X-metal-free phthalocyanine (prepared as described in U.S. Pat. No. 3,357,989 (Byrne et al.), the disclosure of which is totally incorporated by reference) and 80 percent by weight of a styrene-butyl methacrylate copolymer (ICI Neocryl A622). The resulting dispersion is hand coated onto the top softenable layers of the migration imaging members with a #5 Meyer rod, followed by drying the deposited infrared-sensitive layers at 50° C. for 1 minute by contacting the polyester substrates to an aluminum heating block. The infrared-sensitive migration imaging members thus prepared are imaged as follows. The surfaces of the members are uniformly positively charged to surface potentials of from about +250 to about +600 volts with a corona charging device and are subsequently exposed by placing a test pattern mask comprising a silver halide image in contact with the imaging members and exposing the members to infrared light of 773 nanometers through the mask for a period of 20 seconds. The exposed members are subsequently uniformly exposed to 490 nanometer light for a period of 10 seconds and thereafter uniformly negatively recharged to surface potentials of from about −200 to about −500 volts with a corona charging device. The imaging members are then developed by subjecting them to temperatures of from about 85 to about 100° C. for periods of from about 2 to about 5 seconds using a small aluminum heating block in contact with the polyester substrates. Sign-reversed images corresponding to the image on the test pattern mask will subsequently be visible in the developed imaging members.

EXAMPLE VI

Three infrared-sensitive migration imaging members are prepared as follows. Into 97.5 parts by weight of cyclohexanone (analytical reagent grade, available from British Drug House (BDH)) is dissolved 1.75 part by weight of Butvar B-72, a polyvinylbutyral resin (available from Monsanto Plastics & Resins Co.). To the solution is added 0.75 part by weight of X-metal free phthalocyanine (prepared as described in U.S. Pat. No. 3,357,989 (Byrne et al.), the disclosure of which is totally incorporated herein by reference) and 100 parts by weight of ⅛ inch diameter stainless steel balls. The dispersion (containing 2.5 percent by weight solids) is ball milled for 24 hours and then hand coated with a #4 wire wound rod onto a 4 mil thick conductive substrate comprising aluminized polyester (Melinex 442, available from Imperial Chemical Industries (ICI), aluminized to 20 percent light transmission). After the material is dried on the substrate at about 80° C. for about 20 seconds, the film thickness of the resulting pigment-containing layer is about 0.06 micron. Thereafter a solution for the softenable layer is prepared by dissolving about 84 parts by weight of a terpolymer of styrene/ethylacrylate/acrylic acid (prepared as disclosed in U.S. Pat. No. 4,853,307, the disclosure of which is totally incorporated herein by reference) and about 16 parts by weight of N,N'-diphenyl-N,N'-bis(3"-methylphenyl)-(1,1'-biphenyl)-4,4'-diamine (prepared as disclosed in U.S. Pat. No. 4,265,990, the disclosure of which is totally incorporated herein by reference) in about 450 parts by weight of toluene. N,N'-diphenyl-N,N'-bis(3"-methylphenyl)-(1,1'-biphenyl)-4,4'-diamine is a charge transport material capable of transporting positive charges (holes). The resulting solution is coated by a solvent extrusion technique onto the infrared-sensitive pigment containing layers of the imaging members, and the deposited softenable layer is allowed to dry at about 115° C. for about 2 minutes, resulting in a dried softenable layer with a thickness of about 8 microns. Reddish monolayers of selenium particles are then vacuum deposited on the copolymer layers, with a first migration imaging member being vacuum coated as described in Example I, a second migration imaging member being vacuum coated as described in Example II, and a third migration imaging member being vacuum coated as described in Example III. The three infrared-sensitive migration imaging members thus prepared are then imaged as follows. The surfaces of the members are uniformly negatively charged to surface potentials of from about −600 to about −700 volts with a corona charging device and are subsequently uniformly exposed to 490 nanometer light for a period of from about 5 to about 10 seconds, followed by imagewise exposure to infrared light by placing a test pattern mask comprising a silver halide image in contact with the imaging members and exposing the members to infrared light of 773 nanometers through the mask for a period of from about 10 to about 20 seconds. The imaging members are then developed by subjecting them to temperatures of from about 110° to about 120° C. for 5 seconds using a small aluminum heating block in contact with the polyester substrates. Sign-reversed images corresponding to the image on the test pattern mask will subsequently be visible in the developed imaging members.

Other embodiments and modifications of the present invention may occur to those skilled in the art subsequent to a review of the information presented herein; these embodiments and modifications, as well as equivalents thereof, are also included within the scope of this invention.

What is claimed is:

1. An apparatus for evaporation of a vacuum evaporatable material onto a substrate, said apparatus comprising (a) a walled container for the vacuum evaporatable material having a plurality of apertures in a surface thereof, said apertures being configured so that the vacuum evaporatable material is uniformly deposited onto the substrate; and (b) a source of heat sufficient to effect evaporation of the vacuum evaporatable material from the container through the apertures onto the substrate, wherein the surface of the container having the plurality of apertures therein is maintained at a temperature equal to or greater than the temperature of the vacuum evaporatable material.

2. An apparatus according to claim 1 further comprising a second heat source, wherein the second heat source causes evaporation of the vacuum evaporatable material and said first mentioned heat source maintains the surface of the container having the plurality of apertures therein at a temperature equal to or greater than the temperature of the vacuum evaporatable material.

3. An apparatus according to claim 1 wherein the walled container comprises an electrically conductive material and the heat source comprises a source of electrical current coupled to the container and generating heat therethrough.

4. An apparatus according to claim 1 wherein the plurality of apertures are configured so that the aperture area is greater at a lateral marginal edge of the surface than at a medial portion thereof.

5. An apparatus according to claim 1 further comprising a second walled container for the vacuum evaporatable material, said second walled container being heated sufficiently to effect evaporation of the vacuum evaporatable material from the container onto the substrate.

6. An apparatus according to claim 1 wherein the surface having a plurality of apertures is removable from the walled container.

7. An apparatus according to claim 1 further comprising a cooling element situated within the walled container to enable cooling of the vacuum evaporatable material within the walled container without distortion of the walled container subsequent to heating of the walled container and the vacuum evaporatable material.

8. A vacuum coating apparatus comprising a vacuum chamber containing (a) a migration imaging member comprising a first conductive layer and at least one additional layer, wherein at least one of the additional layers is a layer of softenable material; (b) a migration imaging member supply; (c) a migration imaging member takeup, the migration imaging member defining a path between the migration imaging member supply and the migration imaging member takeup; (d) a first member in contact with the migration imaging member and disposed in the path between the migration imaging member supply and the migration imaging member takeup, said first member being heated to a temperature which reduces the viscosity of the softenable material on the migration imaging member to a viscosity sufficiently low to enable material vacuum evaporated thereon to become embedded below the surface of the softenable layer; (e) a second member in contact with the migration imaging member and disposed in the path between the first member and the migration imaging member takeup, said second member being at a temperature which cools the softenable material on the migration imaging member sufficiently to prevent blocking of the softenable layer in the migration imaging member takeup; (f) a walled container for a vacuum evaporatable migration marking material disposed in the path between the first member and the second member, said container having a plurality of apertures in a surface thereof, said apertures being configured so that the vacuum evaporatable migration marking material is uniformly deposited on the substrate; and (g) a source of heat sufficient to effect evaporation of the vacuum evaporatable migration marking material from the container through the apertures onto the substrate, wherein the surface of the container having the plurality of apertures therein is maintained at a temperature equal to or greater than the temperature of the vacuum evaporatable migration marking material.

9. An apparatus according to claim 8 further comprising a second heat source, wherein the second heat source causes evaporation of the vacuum evaporatable migration marking material and said first mentioned heat source maintains the surface of the container having the plurality of apertures therein at a temperature equal to or greater than the temperature of the vacuum evaporatable migration marking material.

10. An apparatus according to claim 8 wherein the walled container comprises an electrically conductive material and the heat source comprises a source of electrical current coupled to the container and generating heat therethrough.

11. An apparatus according to claim 8 wherein the plurality of apertures are configured so that the aperture area is greater at a lateral marginal edge of the surface than at a medial portion thereof.

12. An apparatus according to claim 8 further comprising a second walled container for the vacuum evaporatable migration marking material, said second walled container being heated sufficiently to effect evaporation of the vacuum evaporatable migration marking material material from the container onto the migration imaging member.

13. An apparatus according to claim 8 wherein the surface having a plurality of apertures is removable from the walled container.

14. An apparatus according to claim 8 wherein said first member comprises a roll supported for rotation and in frictional contact with the migration imaging member.

15. An apparatus according to claim 8 further comprising a takeup member disposed to maximize contact between the first member and the migration imaging member.

16. An apparatus according to claim 8 wherein said second member comprises a roll supported for rotation and in frictional contact with the migration imaging member.

17. An apparatus according to claim 8 further comprising a cooling element situated within the walled container to enable cooling of the vacuum evaporatable material within the walled container without distortion of the walled container subsequent to heating of the walled container and the vacuum evaporatable material.

18. A method for evaporation of a vacuum evaporatable material onto a substrate comprising (a) heating a container of the vacuum evaporatable material to a temperature sufficient to prevent condensation of the vacuum evaporatable material at a plurality of discharge apertures, wherein the discharge apertures are configured so that the vacuum evaporatable material is uniformly deposited onto the substrate; (b) depositing the vacuum evaporatable material onto the substrate as the substrate is moved adjacent the discharge apertures.

19. A method according to claim 18 wherein the container comprises an electrically conductive material and heating is effected with a source of electrical current coupled to the container and generating heat therethrough.

20. A method according to claim 18 wherein the substrate is heated prior to deposition of the vacuum evaporatable material onto the migration imaging member.

21. A method according to claim 18 wherein the substrate is cooled subsequent to deposition of the vacuum evaporatable material onto the migration imaging member.

22. A method according to claim 18 wherein the vacuum evaporatable material is selenium.

23. A method according to claim 18 wherein the substrate is a migration imaging member comprising a first conductive layer and at least one additional layer, wherein at least one of the additional layers is a layer of softenable material.

24. A method according to claim 23 wherein the softenable material is heated prior to deposition of the vacuum evaporatable material onto the migration imaging member.

25. A method according to claim 23 wherein the softenable material is cooled subsequent to deposition of the vacuum evaporatable material onto the migration imaging member.

26. A method according to claim 18 wherein the vacuum evaporatable material in the container is cooled subsequent to deposition of the vacuum evaporatable material onto the migration imaging member.

27. An apparatus according to claim 3 wherein the surface having a plurality of apertures is removable from the walled container and wherein the surface having a plurality of apertures is in intimate conductive contact with the walled container so that when current is applied to the walled container, current flows through the surface having a plurality of apertures at a rate equal to or greater than the rate at which it flows through the walled container.

28. An apparatus according to claim 10 wherein the surface having a plurality of apertures is removable from the walled container and wherein the surface having a plurality of apertures is in intimate conductive contact with the walled container so that when current is applied to the walled container, current flows through the surface having a plurality of apertures at a rate equal to or greater than the rate at which it flows through the walled container.

\* \* \* \* \*